US011355459B2

(12) United States Patent
Lee et al.

(10) Patent No.: US 11,355,459 B2
(45) Date of Patent: Jun. 7, 2022

(54) EMBEDDING MAGNETIC MATERIAL, IN A CORED OR CORELESS SEMICONDUCTOR PACKAGE

(71) Applicant: Intel Corporation, Santa Clara, CA (US)

(72) Inventors: Kyu-Oh Lee, Chandler, AZ (US); Sai Vadlamani, Chandler, AZ (US); Rahul Jain, Gilbert, AZ (US); Junnan Zhao, Gilbert, AZ (US); Ji Yong Park, Chandler, AZ (US); Cheng Xu, Chandler, AZ (US); Seo Young Kim, Chandler, AZ (US)

(73) Assignee: Intel Corpoation, Santa Clara, CA (US)

( * ) Notice: Subject to any disclaimer, the term of this patent is extended or adjusted under 35 U.S.C. 154(b) by 875 days.

(21) Appl. No.: 15/982,652

(22) Filed: May 17, 2018

(65) Prior Publication Data

US 2019/0355675 A1 Nov. 21, 2019

(51) Int. Cl.
*H01L 23/60* (2006.01)
*H01L 23/64* (2006.01)
(Continued)

(52) U.S. Cl.
CPC ............. *H01L 23/645* (2013.01); *H01F 1/12* (2013.01); *H01F 41/14* (2013.01);
(Continued)

(58) Field of Classification Search
CPC ........... H01L 23/49822; H01L 21/4857; H01L 2924/19042; H01L 23/49827;
(Continued)

(56) References Cited

U.S. PATENT DOCUMENTS 7,675,401 B2 * 3/2010 Cheng .................... H05K 1/165
                                                        338/226
9,368,564 B2 * 6/2016 Zuo ..................... H01F 17/0013
(Continued)

FOREIGN PATENT DOCUMENTS

JP   2010-205905   9/2010

OTHER PUBLICATIONS

International Search Report and Written Opinion for International Patent Application No. PCT/US2019/026621 dated Jul. 22, 2019, 11 pgs.
(Continued)

*Primary Examiner* — William H. Mayo, III
*Assistant Examiner* — Krystal Robinson
(74) *Attorney, Agent, or Firm* — Schwabe, Williamson & Wyatt, P.C.

(57) ABSTRACT

Techniques for fabricating a semiconductor package having magnetic materials embedded therein are described. For one technique, fabrication of package includes: forming a pad and a conductive line on a build-up layer; forming a raised pad structure on the build-up layer, the raised pad comprising a pillar structure on the pad; encapsulating the conductive line and the raised pad structure in a magnetic film comprising one or more magnetic fillers; planarizing a top surface of the magnetic film until top surfaces of the raised pad structure and the magnetic film are co-planar; depositing a primer layer on the top surfaces; removing one or more portions of the primer layer above the raised pad structure to create an opening; and forming a via in the opening on the raised pad structure. The primer layer may comprise one or more of a build-up layer, a photoimageable dielectric layer, and a metal mask.

25 Claims, 12 Drawing Sheets

(51) Int. Cl.
　　　*H01L 23/498* (2006.01)
　　　*H01L 21/48* (2006.01)
　　　*H01L 23/00* (2006.01)
　　　*H01F 1/12* (2006.01)
　　　*H01F 41/14* (2006.01)

(52) U.S. Cl.
　　　CPC ...... *H01L 21/4857* (2013.01); *H01L 21/4867* (2013.01); *H01L 23/49822* (2013.01); *H01L 23/49838* (2013.01); *H01L 23/49866* (2013.01); *H01L 24/16* (2013.01); *H01L 2224/16225* (2013.01); *H01L 2924/19042* (2013.01); *H01L 2924/19103* (2013.01)

(58) Field of Classification Search
　　　CPC ......... H01L 23/645; H01L 2224/73265; H01L 2924/181; H01L 2924/013; H01L 2224/05599; H01L 2924/014; H01L 23/295; H01L 23/5227; H01L 28/10; H05K 1/115; H05K 1/165; H05K 2201/086; H05K 2201/09245; H05K 3/4602; H05K 3/4605; H05K 7/20481; H05K 1/0373; H05K 2201/0338; H05K 2201/083; H05K 2203/104; H05K 1/0228; H05K 1/0231; H05K 1/0233; H05K 1/0243; H05K 1/0251; H05K 1/0393; H05K 1/181; H05K 1/183; H05K 2201/0129; H05K 2201/0209; H05K 2201/0317; H05K 2201/09072; H05K 2201/10098; H05K 2203/095; H05K 2203/1476; H05K 9/0024; H05K 9/0075; H05K 9/0084; H05K 1/0293; H05K 1/0353; H05K 1/111; H05K 2201/0141; H05K 2201/0215; H05K 2201/068; H05K 2201/09745; H05K 2201/10106; H05K 2203/166; H05K 3/323; H05K 3/325; H05K 3/3436; H05K 3/386; H05K 3/4007; H05K 3/4069; H05K 3/4626

See application file for complete search history.

(56) References Cited

U.S. PATENT DOCUMENTS

| | | | |
|---|---|---|---|
| 10,117,334 B2* | 10/2018 | Zeng | H05K 1/181 |
| 10,128,037 B2* | 11/2018 | Kim | H01F 5/00 |
| 10,842,021 B1* | 11/2020 | Song | H01F 17/0013 |
| 2002/0182374 A1* | 12/2002 | Tung | H05K 1/162 |
| | | | 156/81 |
| 2005/0099259 A1* | 5/2005 | Harris | H01L 24/13 |
| | | | 336/200 |
| 2008/0026588 A1 | 1/2008 | Hwang et al. | |
| 2010/0225434 A1* | 9/2010 | Wang | H01F 27/2804 |
| | | | 336/200 |
| 2014/0159850 A1 | 6/2014 | Roy et al. | |
| 2017/0047155 A1* | 2/2017 | Yao | H01F 3/10 |
| 2017/0092412 A1 | 3/2017 | Manusharow et al. | |
| 2018/0075965 A1 | 3/2018 | Yoshioka et al. | |
| 2019/0295967 A1* | 9/2019 | Darmawikarta | H01F 27/2804 |

OTHER PUBLICATIONS

International Preliminary Report on Patentability for International Patent Application No. PCT/US2019/026621 dated Nov. 26, 2019, 8 pgs.

* cited by examiner

EMBEDDING MAGNETIC MATERIAL, IN A CORED OR CORELESS SEMICONDUCTOR PACKAGE

BACKGROUND

Field

Embodiments described herein relate to semiconductor packages. More specifically, the described embodiments are directed to semiconductor packages having one or more magnetic materials embedded therein and techniques of forming such packages.

Background Information

An inductor is a passive electronic component that is typically included in a semiconductor package comprising one or more semiconductor dies. One or more inductors can be used to form a functional or fully integrated voltage regulator (IVR). The IVR can provide one or more voltage regulators for semiconductor die(s) within a semiconductor package.

Inductors used in semiconductor packages can take multiple forms. Examples include, but are not be limited to, discrete inductors and air core inductors (ACIs).

Discrete inductors are generally prepackaged inductor devices (e.g., off-chip, off-package devices comprising one or more inductors, etc.). Discrete inductors typically include at least one magnetic core inductor (MCI). An MCI is an inductor comprising an insulated wire wound into a coil around a magnetic core made of a ferromagnetic or ferrimagnetic material (e.g., iron, ferrite, etc.). A magnetic core can increase the inductance of a coil by increasing the magnetic field. This increase is due to the magnetic core's higher magnetic permeability (as opposed to the relatively lower magnetic permeability of the coil itself or of a non-magnetic core such as air, glass, mica, plastic, ceramic, or any other dielectric material). Most discrete inductors are proprietary to and outsourced from third party vendors. These inductors are embedded in or surface mounted on a package substrate during semiconductor package fabrication. As used herein, a "package substrate" includes one or more of: (i) a package substrate core formed from any suitable material; and (ii) one or more layers (e.g., a metal layer, a interlayer dielectric layer, a build-up layer, a seed layer, any other layer known in the art of semiconductor manufacturing and/or packaging, etc.).

There are some drawbacks associated with discrete inductors. Discrete inductors can be costly (when compared to ACIs). Also, the embedding processes used to incorporate discrete packages into semiconductor packages can be complicated. Additionally, the surface mounting processes used to incorporate discrete packages into semiconductor packages can add an undesired thickness (e.g., z-height, etc.) to the overall thickness of the resulting semiconductor package. Discrete inductors might also require extra space outside a semiconductor package, which can be difficult to achieve in high-density microelectronic devices. Additionally, because discrete inductors are usually prepackaged devices that are proprietary to third party vendors, package design may be limited.

ACIs are typically embedded in semiconductor packages. Conventional ACI formation involves forming one or more features, portions, or constituent parts of an inductor ("inductor features") on or in one or more layers of a package substrate. For example, conductive lines may be patterned on a layer to form one or more inductor features. Examples of inductor features include, but are not limited to, a coil having any shape (e.g., a loop, a square, a circle, a spiral, etc.) formed from conductive lines and one or more pads. Generally, an ACI formed in a semiconductor package does not include a magnetic core. As a result, an ACI's magnetic permeability can be lower than an MCI's magnetic permeability. For example, the magnetic permeability of an ACI may be approximately equal to the magnetic permeability of air. Examples of conductive lines are copper lines, aluminum lines, lines formed from any other metal or metal alloy as is known in the art of semiconductor packaging and/or manufacturing, etc.

ACIs have some drawbacks even though they can be less expensive than discrete inductors. One drawback is that ACIs may not generate inductance as effectively or as efficiently as discrete inductors. Another drawback is that ACIs can take up valuable real estate in a package substrate in order to generate a target inductance, which can in turn reduce the achievable input/output (I/O) density per mm per layer (IO/mm/layer) in a semiconductor package.

Several proposals for inductors that lack the drawbacks described above are in existence. One proposal is to fabricate an ACI comprising a magnetic material (e.g., one or more magnetic fillers, a film comprising one or more magnetic fillers, a paste composition comprising one or more magnetic fillers, an ink comprising one or more magnetic fillers, etc.). Magnetic materials can increase an AIC's magnetic permeability, which can in turn enhance the AIC's performance. Magnetic materials, however, are not easily integrated into current semiconductor fabrication processes that comply with current industry standards. One drawback associated with the magnetic material(s) is that laser drilling of vias through the magnetic material(s) may be difficult, costly, or complicated. For a first example, after laser drilling of a magnetic material to form vias is performed, some of the material's magnetic fillers are not ablated away, which in turn leaves residue in the resulting vias creating unwanted "dirty vias." Another drawback associated with the magnetic material(s) is a risk of contamination of bath chemistries associated with wet processes and/or a risk of contamination of tools or materials used in etching techniques. For example, magnetic fillers in the magnetic material(s) may have negative, undesirable, or unexpected interactions with bath chemistries, materials, and/or tools used in, for example, desmearing processes, electroless plating processes, flash etching processes, soft etching processes, seed etching processes, processes involving roughening baths. For another example, introduction of magnetic material(s) to certain bath chemistries may result in corrosion, destruction, dissolution, or degradation of the magnetic fillers in the magnetic material(s). For this example, corrosion of the magnetic fillers may cause the magnetic fillers to leach into bath chemistries, which can in turn contaminate the baths and reduce the life cycle of the baths. Consequently, and for this example, a semiconductor package formed using the contaminated baths and the magnetic material(s) may exhibit suboptimal properties (e.g., suboptimal electrical performance, etc.).

One proposal to minimize or eliminate the drawbacks described above is to tailor the magnetic material(s) described above to current semiconductor fabrication processes that comply with current industry standards. Another proposal to minimize or eliminate the drawbacks described above is to tailor bath chemistries associated with wet processes and/or tools or materials used in etching techniques to work with the magnetic material(s) described above. These tailoring processes, however, can be time-consuming and expensive endeavors, which can in turn increase costs associated with semiconductor manufacturing and/or packaging. Furthermore, these tailoring processes may run a risk of over-engineering—that is, the magnetic material(s), the bath chemistries associated with wet processes, and/or the tools or materials used in etching techniques may be suboptimally designed. For example, a specific type of magnetic filler with suboptimal magnetic permeability properties (when compared to other types of magnetic fillers) may be used to form the magnetic material(s). For this example, the chosen magnetic filler is used despite the existence of other magnetic fillers with more optimal magnetic permeability properties in order to minimize or eliminate one or more of the drawbacks described above in connection with magnetic material(s).

BRIEF DESCRIPTION OF THE DRAWINGS

Embodiments described herein are illustrated by way of example and not limitation in the figures of the accompanying drawings, in which like references indicate similar features. Furthermore, in the figures, some conventional details have been omitted so as not to obscure from the inventive concepts described herein.

DETAILED DESCRIPTION

Figure 1A:
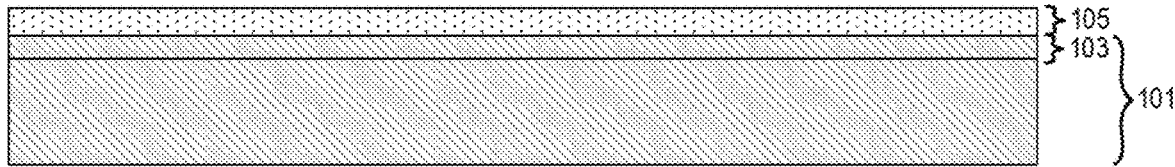
FIGS. 1A-1S are cross-sectional side view illustrations of a method of forming a semiconductor package having one or more magnetic materials embedded therein according to one embodiment.

Embodiments described herein provide techniques that can assist with fabricating a cored or coreless semiconductor package having one or more magnetic materials embedded therein. For one or more embodiments, an inductor in a cored or coreless semiconductor package comprises one or more of the magnetic materials. Several advantages are provided by the embodiments described herein. One advantage is that the embodiment(s) described herein can assist with creating a chemically resilient technique of manufacturing an inductor comprising one or more of the embedded magnetic materials in a cored or coreless semiconductor package. Another advantage is that the embodiment(s) described herein can assist with providing flexibility towards the choice of materials used for fabricating a cored or coreless semiconductor package. Yet another advantage is that magnetic material(s), which are embedded in a semiconductor package that is fabricated in accordance with one or more of the embodiments described herein, are isolated from interacting with bath chemistries, materials, and/or tools used in desmearing processes, electroless plating processes, flash etching processes, soft etching processes, seed etching processes, processes involving roughening baths, etc. One more advantage of the embodiments described herein is that no investment in specialized equipment is required to perform the techniques described herein. Another advantage is that the magnetic material(s) can be embedded in any package substrate used to form a semiconductor package. In this way, one or more drawbacks associated with the magnetic material(s) as described above may be minimized or eliminated, which can in turn reduce costs associated with semiconductor manufacturing and/or packaging, with increasing the achievable IO/mm/layer in a semiconductor package, with enhancing one or more properties of a semiconductor package (e.g., enhancing a package's electrical performance, etc.), and with reducing a thickness (e.g., z-height, etc.) of a semiconductor package.

As used herein, the phrase "magnetic material" and its variations include, but are not limited to, one or more magnetic fillers, a magnetic film comprising one or more magnetic fillers, a magnetic paste composition comprising one or more magnetic fillers, and a magnetic ink comprising one or more magnetic fillers. Magnetic fillers may be formed from iron, ferrite, any other ferromagnetic or ferrimagnetic material, any other suitable material or combination of materials having magnetic properties, any compound comprising one or more of the preceding examples, or any combination of two or more of the preceding examples. Examples of magnetic fillers include, but are not limited to, iron (Fe), cobalt (Co), nickel (Ni), any ferrite that includes Fe and oxygen (O), ferrous oxide (FeO), a metal alloy comprising one or more of Fe, Co, and Ni (e.g., CoFe, NiFe, etc.), any ferromagnetic material, any ferrimagnetic material, and any combination thereof.

As used herein, the phrase "magnetic film" and its variations include, but are not limited to, a dielectric laminate film having one or more magnetic fillers embedded therein, an epoxy laminate film having one or more magnetic fillers embedded therein, an organic laminate film having one or more magnetic fillers embedded therein, an organic dielectric epoxy laminate film having one or more magnetic fillers embedded therein, a laminate film formed from any suitable material or combination of materials capable of having one or more magnetic fillers embedded therein, and any combination of two or more of the preceding films. For one embodiment, a magnetic film comprises: (i) one or more of an epoxy resin, a polyimide, and a glass-reinforced epoxy laminate material (e.g., FR4, G10, G11, FR4, FR5, FR6, etc.); and (ii) one or more magnetic fillers. One specific example of a magnetic film is an organic dielectric epoxy laminate film having magnetic fillers embedded therein.

As used herein, the phrase "magnetic paste composition", a "magnetic paste," and its variations include, but are not limited to, a magnetically permeable paste having magnetic fillers embedded therein. One non-limiting example of a magnetic paste composition is a paste comprising: (i) a suitable material (e.g., metallic material, polymeric material, any suitable organic material, any suitable inorganic material, any combination thereof, etc.); and (ii) one or more magnetic fillers. Another non-limiting example of a magnetic paste is a non-conductive epoxy or a polymer filled with one or more magnetic fillers. Yet another non-limiting example of a magnetic paste is a magnetic paste comprising: (i) any suitable magnetic paste powder known in the art of semiconductor manufacturing and/or fabrication (e.g., manganese zinc ferrite, any other suitable magnetic paste, any combination of suitable magnetic pastes, etc.); and (ii) one or more magnetic fillers.

As used herein, the phrase "magnetic ink" and its variation include, but are not limited to, a magnetically permeable ink having magnetic fillers embedded therein. One non-limiting example of a magnetic ink is an ink comprising: (i)

any suitable material (e.g., metallic material, polymeric material, any suitable organic material, any suitable inorganic material, any combination thereof, etc.); and (ii) one or more magnetic fillers.

For one or more embodiments, forming a cored or coreless semiconductor package having one or more magnetic materials embedded therein includes, at least in part, application of one or more of the following processes: (i) one or more lithography techniques (e.g., any known photolithography and/or lithography techniques, etc.); and (ii) one or more via-formation techniques (e.g., techniques of forming zero-misalignment vias, techniques of forming self-aligned vias, any other suitable via-formation technique, any combination of suitable via-formation techniques, etc.).

For one or more embodiments, a cored or coreless semiconductor package is formed. For one embodiment, forming the cored or coreless semiconductor package comprises: forming a pad and a conductive line on a build-up layer; forming a raised pad structure on the build-up layer by fabricating a pillar structure on the pad; encapsulating the conductive line and the raised pad structure in a magnetic film; planarizing a top surface of the magnetic film until top surfaces of the raised pad structure and the magnetic film are co-planar; depositing a primer layer on the top surfaces of the raised pad structure and the magnetic film; and forming a via on the top surface of the raised pad structure by removing one or more portions of the primer layer above the raised pad structure. For one embodiment, forming the cored or coreless semiconductor package also comprises one or more of the following: forming a conductive structure over the via; forming a second pad and a second conductive line on the primer layer; encapsulating the second conductive line in a magnetic paste; and desmearing the via to remove any residue in the via.

For one embodiment, forming the pad and the conductive line comprises lithographically exposing portions of a first resist layer on the build-up layer, removing the exposed portions of the first resist layer to create a first set of openings, depositing metallic materials in the first set of openings, and removing any lithographically unexposed portion of the first resist layer. For one embodiment, forming the pillar structure comprises lithographically exposing a portion of a second resist layer on uncovered surfaces of the pad, the conductive line, and the build-up layer, removing the exposed portion of the second resist layer to create a second opening on the pad, depositing metallic materials in the second opening, and removing any lithographically unexposed portion of the second resist layer. For one embodiment, the magnetic film comprises one or more magnetic fillers. For one embodiment, the raised pad structure has a z-height that is larger than a z-height of the conductive line. For one embodiment, planarizing a top surface of the magnetic film comprises using a mechanical planarization technique to planarize the top surface of the magnetic film until top surfaces of the raised pad structure and the magnetic film are co-planar. For one embodiment, a size of the via is less than or equal to a corresponding size of the raised pad structure. For one embodiment, the primer layer comprises one or more of: (i) a second build-up layer; and (ii) a photoimageable dielectric (PID) layer. For one embodiment, the primer layer further comprises a metal mask on one or more of: (i) the second build-up layer; and (ii) the PID layer. For one embodiment, when the primer layer comprises a metal mask on the second build-up layer, forming the via on the top surface of the raised pad structure by removing the one or more portions of the primer layer above the raised pad structure comprises: depositing a third resist layer on the metal mask; lithographically exposing a portion of the third resist layer on the metal mask that is above the pillar structure; removing the lithographically exposed portion of the third resist layer to create a third opening; removing a portion of the metal mask in the third opening; removing any lithographically unexposed portion of the third resist layer; removing a portion of the second build-up layer that is above the pillar structure to form the via; and removing any remaining portion of the metal mask on the second build-up layer. For one embodiment, removing the portion of the second build-up layer that is above the pillar structure to form the via comprises plasma etching the second build-up layer that is above the pillar structure.

Figure 1B:
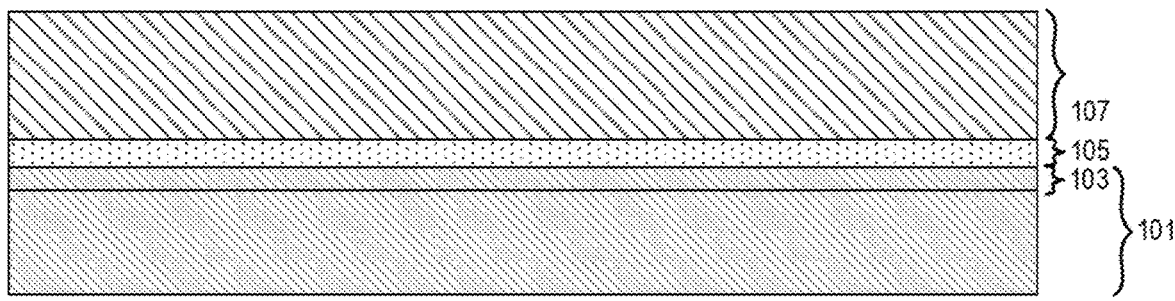
Figure 1C:
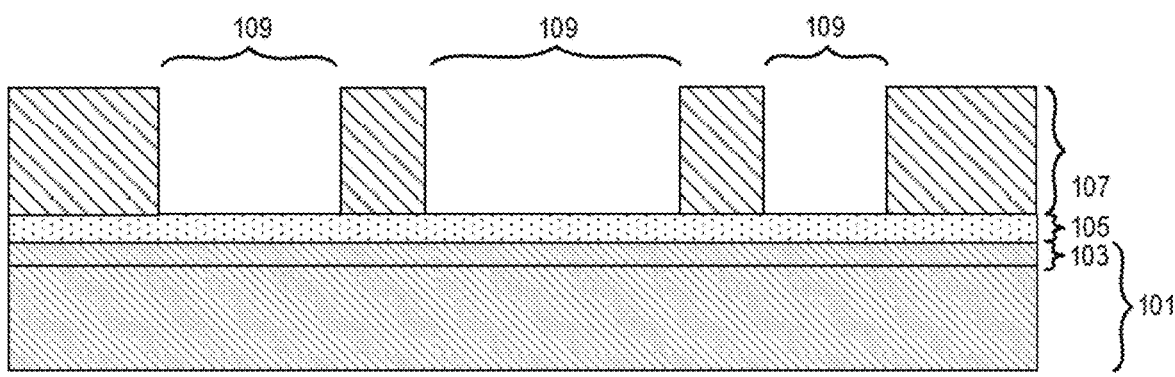
Figure 1D:
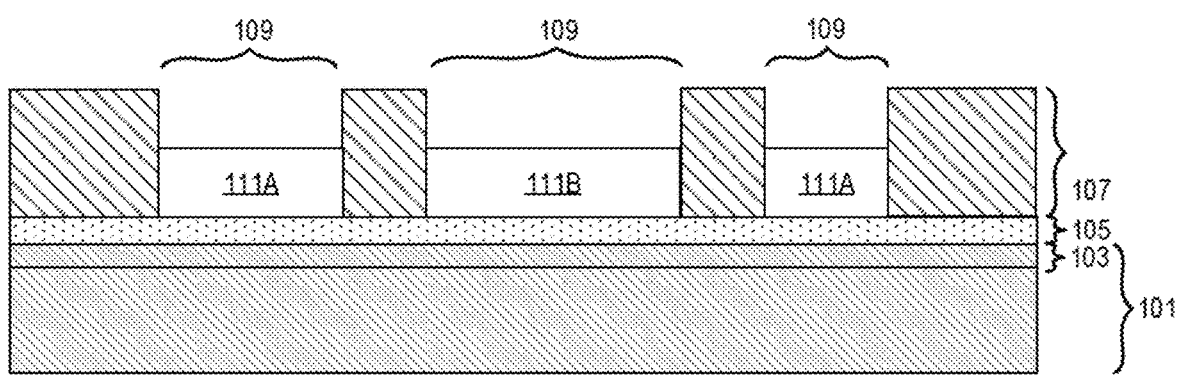
Figure 1E:
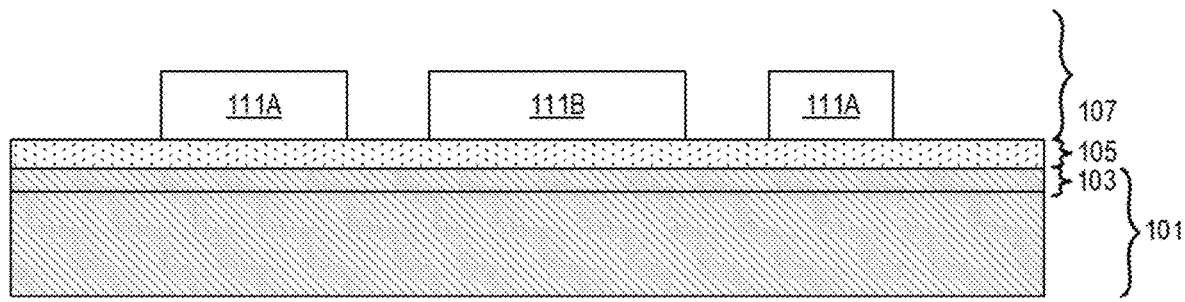
Figure 1F:
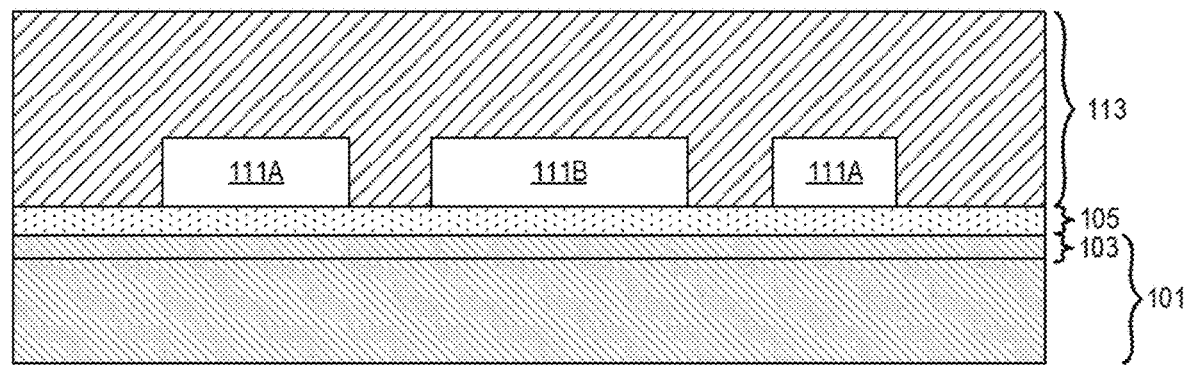
Figure 1G:
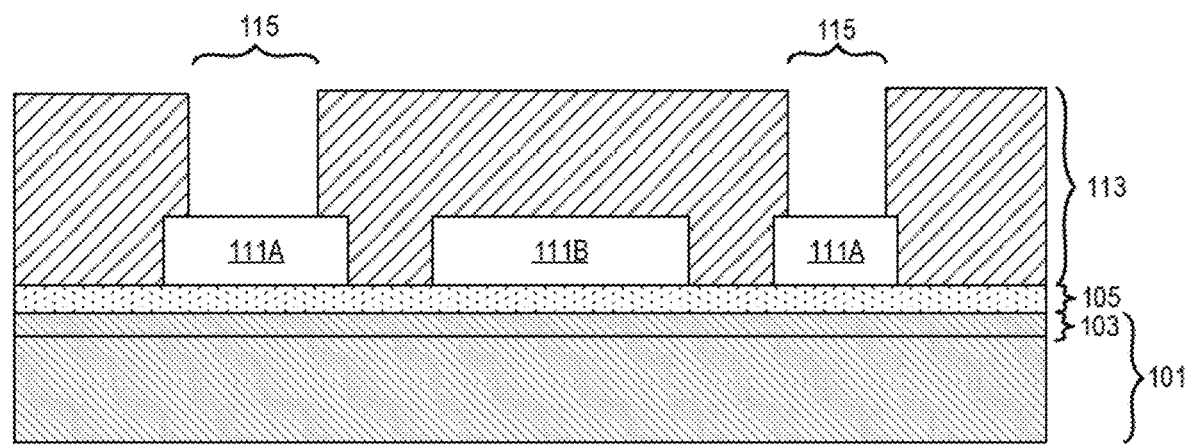
Figure 1H:
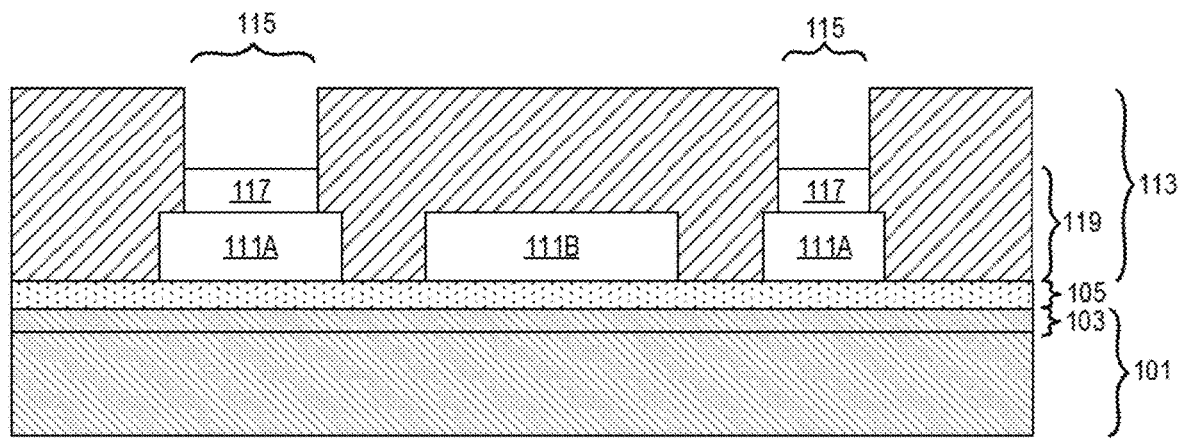
Figure 1I:
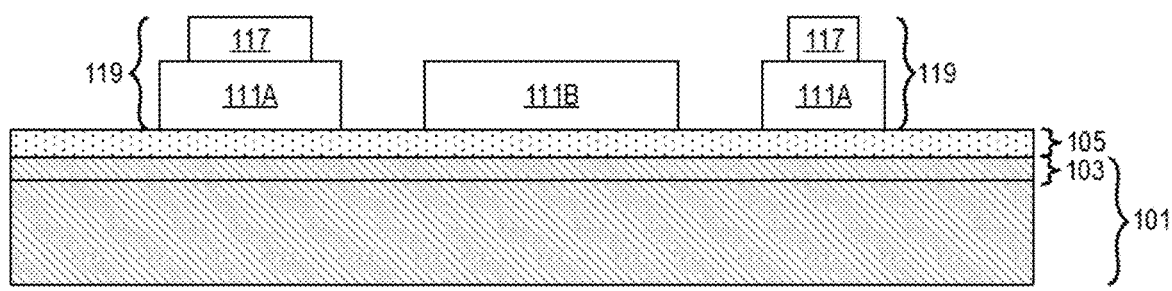
Figure 1J:
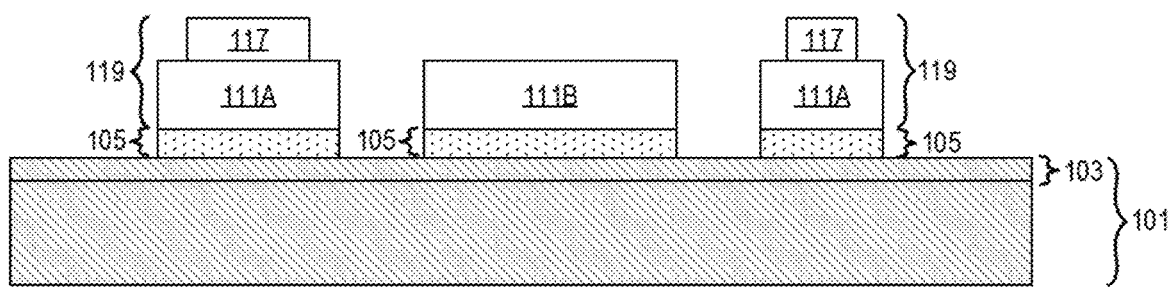
Figure 1K:
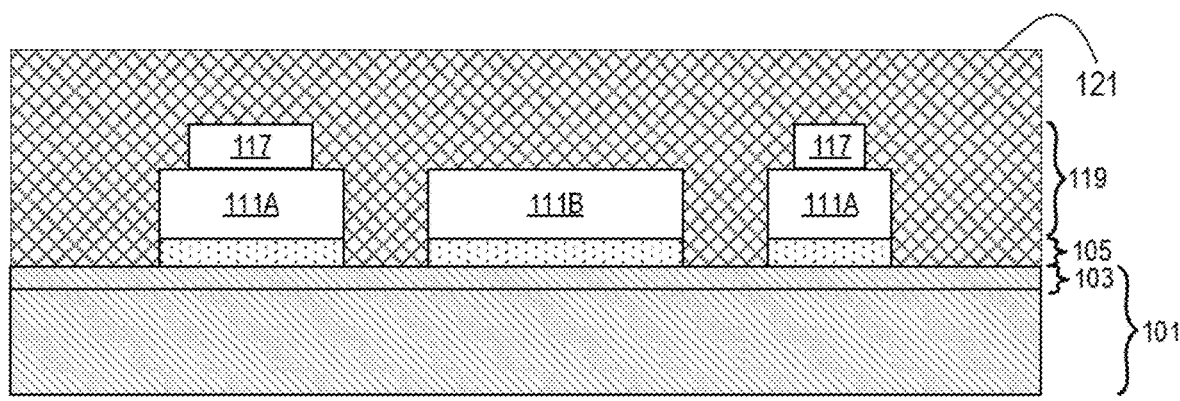
Figure 1L:
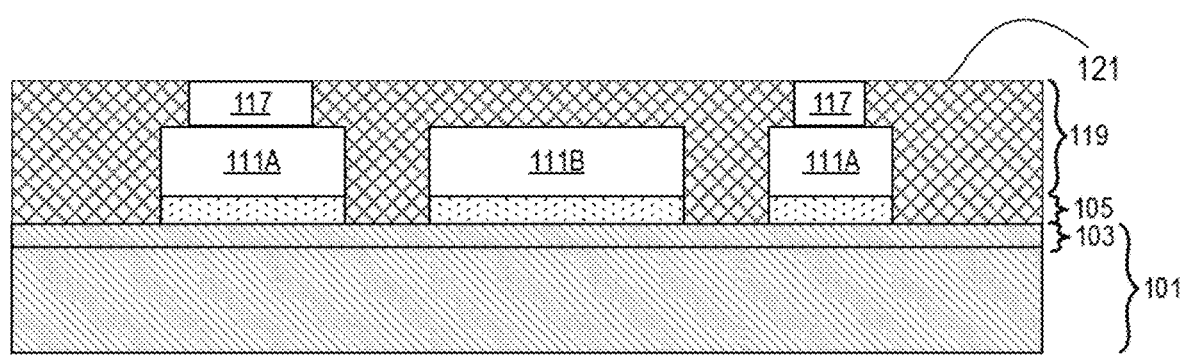
Figure 1M:
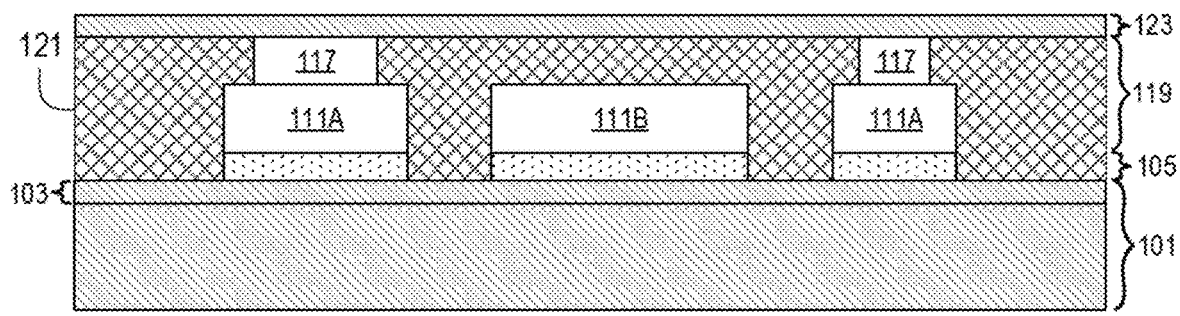
Figure 1N:
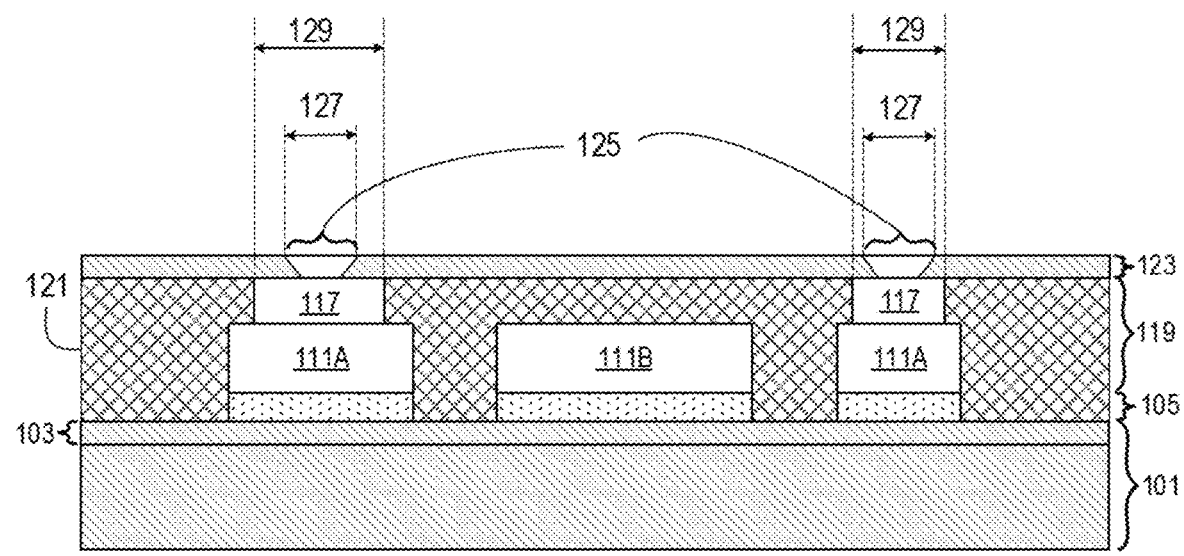
Figure 1O:
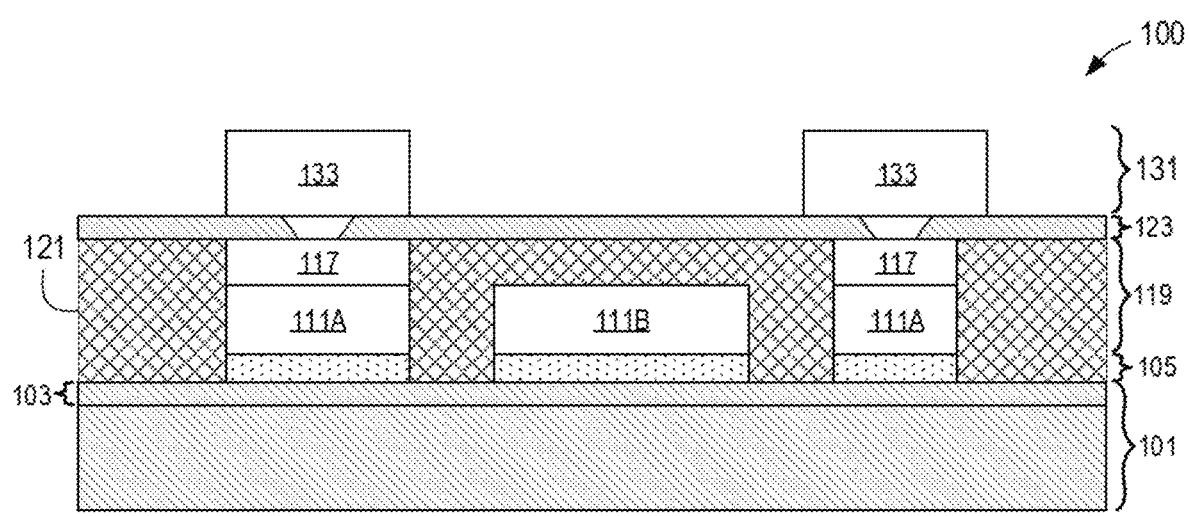
Figure 1P:
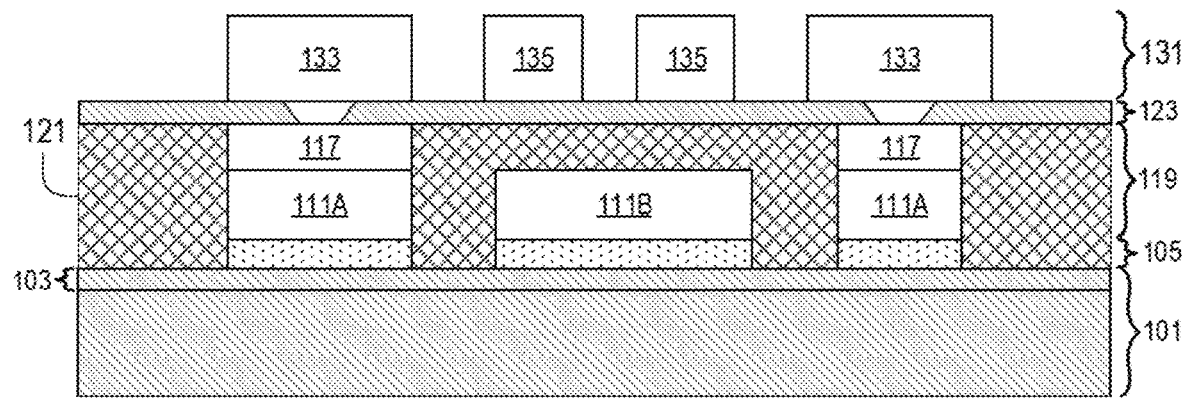
Figure 1Q:
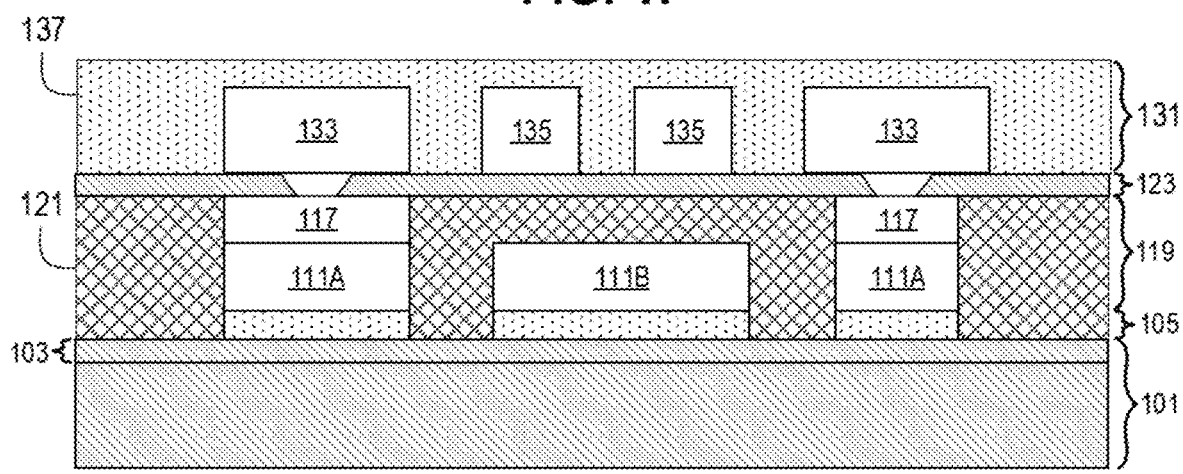
Figure 1R:
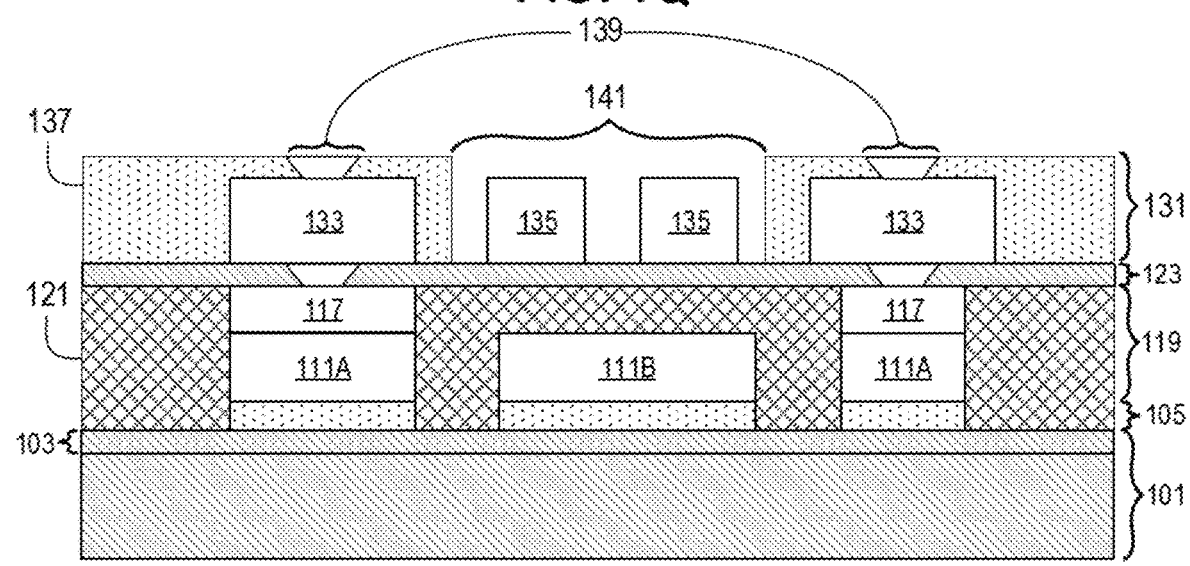
Figure 1S:
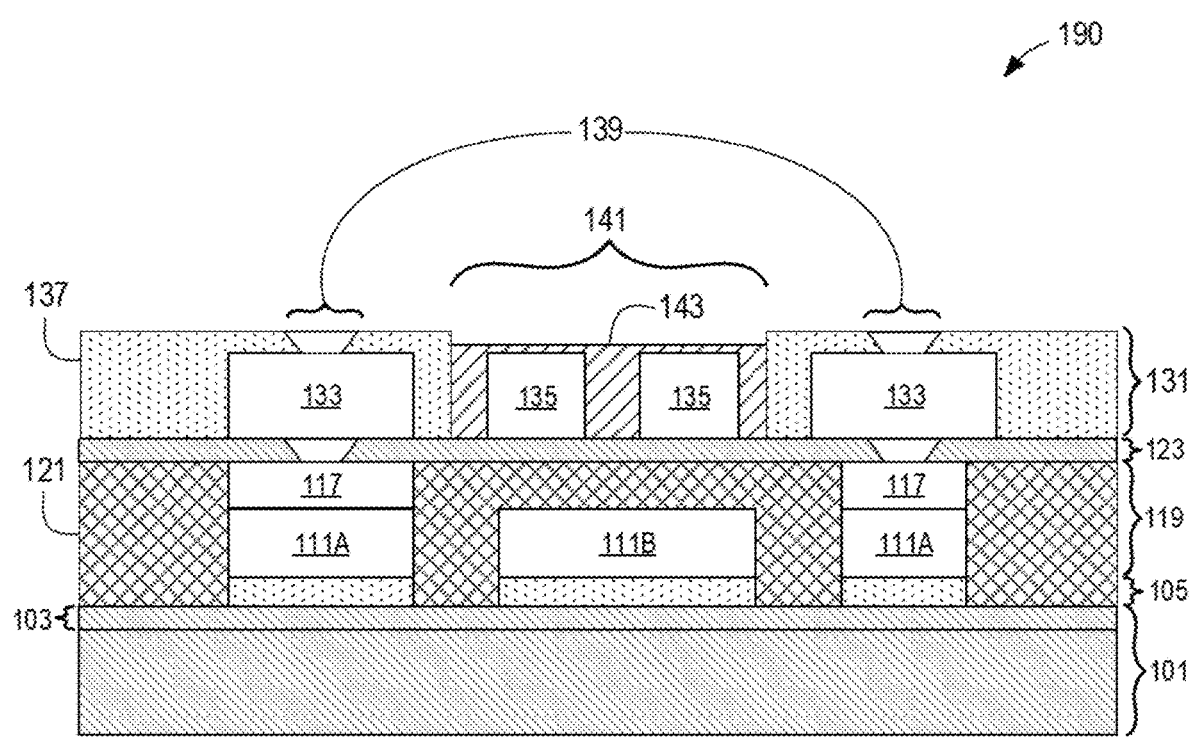

FIGS. 1A-1S are cross-sectional side view illustrations of a method of forming a semiconductor package comprising inductor features and a magnetic film according to one or more embodiments. The method shown in FIGS. 1A-1S omits one or more processes, operations, and/or steps known in the art of semiconductor manufacturing and/or packaging for simplicity and to avoid obscuring or convoluting one or more of the inventive concepts described herein. Also, for brevity, the phrase "the art", "the art of semiconductor manufacturing and/or packaging" and their variations as used herein comprise one or more of: (i) the art of semiconductor manufacturing; (ii) the art of semiconductor packaging; (iii) the field of semiconductor manufacturing; and (iv) the field of semiconductor packaging.

With regard now to FIG. 1A, a package substrate 101 is provided. The package substrate 101 resides on a cored or coreless substrate (not shown). The cored or coreless substrate on which the package substrate 101 resides may be processed using a semi-additive process (SAP). The cored or coreless substrate on which the package substrate 101 resides may be formed from any suitable materials known in the art (e.g., metal, metal alloys, silicon, epoxy resins, organic materials, inorganic materials, any combination thereof, etc.). The cored or coreless substrate on which the package substrate 101 resides may comprise a semiconductor substrate. The semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the cored or coreless substrate on which the package substrate 101 resides may be formed are described here, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of embodiments described herein.

For one embodiment, the cored or coreless substrate on which the package substrate 101 resides comprises an organic substrate. For one embodiment, the cored or coreless substrate on which the package substrate 101 resides comprises Ajinomoto Build-up Film (ABF), liquid crystal polymer, benzocyclobutene (BCB), polyimide, prepreg (a weaved fiber network "preimpregnated" into an epoxy matrix), epoxy, or any combination thereof. For one embodiment, the cored or coreless substrate on which the package substrate 101 resides comprises inorganic fillers, such as silica. For one embodiment, the package substrate 101 is a multi-chip package substrate. For one embodiment, the package substrate 101 is a System-in-Package (SiP) substrate. For another embodiment, substrate is an interposer substrate.

For one embodiment, the cored or coreless substrate on which the package substrate 101 resides includes metal layers comprising conductive lines, pads, and/or electronic devices for integrated circuits (ICs). Examples of these electronic devices include, but are not limited to, transistors, memories, capacitors, inductors, resistors, optoelectronic devices, switches, and any other active and passive electronic devices that are separated by an electrically insulating layer, for example, an interlayer dielectric, a trench insulation layer, or any other insulating layer known in the art of the semiconductor manufacturing and/or packaging. For one or more embodiments, the cored or coreless substrate on which the package substrate 101 resides includes interconnects, for example, vias, configured to connect the metal layers.

The cored or coreless substrate may be manufactured using semi-additive processing (SAP) technology. The SAP process flow can include pre-treating the cored or coreless substrate on which the package substrate 101 is pre-treated. This pre-treatment can include one or more of: (i) a surface roughening process; and (ii) formation of one or more metal layers on the cored or coreless substrate. Surface roughening is known in the art of the semiconductor manufacturing and/or packaging and may include a process of abrading a top surface of cored or coreless substrate (mechanically, chemically, or both) to improve the adhesion of the cored or coreless substrate with subsequently formed layers and structures (e.g., metal layer(s), the package substrate 101, etc.). Surface roughening may be performed on a dielectric layer (e.g., an ABF film, etc.). Pre-treatment of the cored or coreless substrate may also include forming one or more metal layers after surface roughening is performed. For example, the SAP process flow may include depositing a seed layer on a dielectric layer, depositing a resist layer on the seed layer, using a lithography process to create a patterned resist layer, selectively depositing metal in the patterned resist layer to form a metal layer, and subsequently removing any remaining portions of the resist, seed, and dielectric layers such that only the metal layer remains on the cored or coreless layer. For an embodiment, the metal layer(s) may be formed by a conventional electroplating process. The metal layer(s) may include copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), Vanadium (V), Molybdenum (Mo), palladium (Pd), gold (Au), silver (Au), platinum (Pt), or any combination thereof. For one embodiment, conductive layers include a metal alloy or a compound that includes copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), Vanadium (V), molybdenum (Mo), palladium (Pd), gold (Au), silver (Au), or platinum (Pt), or any combination thereof. For other embodiments, the metal layer(s) may comprise any suitable material or combination of materials known in the art.

With regard again to FIG. 1A, for some embodiments, the package substrate 101 may be similar to or the same as the cored or coreless substrate described above. For one embodiment, the package substrate 101 comprises one or more layers. For example, the package substrate 101 may comprise one or more of: (i) at least one build-up layer (e.g., a dielectric layer, a build-up film, etc.), (ii) at least one metal layer; and (iii) one or more other layers known in the art (e.g., resist layer, seed layer, interlayer dielectric layer, barrier layer, passivation layer, protection layer, etc.).

The package substrate 101 may be manufactured using semi-additive processing (SAP) technology. For one embodiment, the SAP process flow used for the package substrate 101 includes depositing a build-up layer 103. The build-up layer may comprise any suitable material such as, for example, a polymer. One example of a suitable material for the build-up layer 103 is an Ajinomoto Build-up Film (ABF). The build-up layer 103 can be deposited using one or more suitable dielectric deposition techniques known to one of ordinary skill in the art. For example, the build-up layer 103 can be deposited via one or more lamination techniques known in the art. For one embodiment, the SAP process flow used for the package substrate 101 includes processing the build-up layer 103 using one or more surface roughening techniques known in the art. For one embodiment, the build-up layer 103 is laminated on the cored or coreless substrate (not shown) such that one or more metal layers of the cored or coreless substrate are electrically isolated from subsequent layers formed on the build-up layer 103.

With regard again to FIG. 1A, for one embodiment, a seed layer 105 is deposited or plated on a top surface of the build-up layer 103. The seed layer 105 can be formed from Cu, Ti, or any other suitable material or combination of materials used to form seed layers as is known in the art. The seed layer 105 can be deposited via any suitable deposition technique, e.g., an electroless plating, sputtering, chemical vapor deposition (CVD), metalorganic chemical vapor deposition (MOCVD), atomic layer deposition (ALD), any other suitable technique of depositing seed layers, a combination thereof.

With regard now to FIG. 1B, for one embodiment, a resist layer 107 is deposited on the seed layer 105. For an embodiment, the resist layer 107 is formed from resist or photoresist material(s). The resist or photoresist material(s) may comprise any suitable dielectric material known in the art (e.g., a dielectric material suitable for processing by etching techniques, etc.). The resist or photoresist material(s) may be in film form, paste form, or liquid form. The resist or photoresist material(s) may comprise positive and/or negative tone dielectric materials.

For one embodiment, the resist layer 107 is patterned using one or more lithography techniques (not shown in FIG. 1B). A lithography technique can include exposing one or more portions of the resist layer 107 to light (e.g., ultra-violet (UV), etc.) via a photomask. The lithography technique form one or more patterns in the resist layer 107. Any lithography technique known in the art can be used.

With regard now to FIG. 1C, the exposed resist layer 107 described above may be processed using a removal technique can include removing, stripping, or etching away the exposed portions of the resist layer 107 to reveal a circuit pattern comprising openings 109. The transferred circuit pattern can include, but is not limited to, a pattern for one or more pads 111A and one or more conductive lines 111B. Conductive lines 111B may also be referred to as conductive lines 111B in the description below. For one embodiment, the removal technique can be any suitable removal technique known in the art. For example, the removal technique can include chemical etching techniques, etc.

Referring now to FIG. 1D, pads 111A and conductive lines 111B may be formed in the openings 109 of the patterned resist layer 107. In some embodiments, forming pads 111A and conductive lines 111B may include depositing one or more metal layers in the openings 109. For one embodiment, forming pads 111A and conductive lines 111B comprises performing an electrolytic metal plating operation to plate one or more metal layers (e.g., Cu, etc.) onto the top surfaces of the seed layer 105 that are not covered by the resist layer 107 so as to fill the openings 109 that remain after removal of exposed portions of the resist layer 107. As shown in FIG. 1D, each of the pads 111A and conductive lines 111B is separated by two pillars of the unexposed resist layer 107. Top surfaces of the pads 111A and conductive lines 111B may or may not be co-planar with top surfaces of the unexposed portions of the resist layer 107. For one embodiment, the pads 111A and conductive lines 111B have z-heights that are lower than z-heights of the unexposed portions of the resist layer 107. In this way, top surfaces of the pads 111A and conductive lines 111B are not co-planar with top surfaces of the unexposed portions of the resist layer 107. The one or more metal layers used to form pads 111A and conductive lines 111B can be deposited via any suitable deposition technique, e.g., a plating technique, any suitable technique of depositing metal layers, any combination of suitable techniques, etc. The one or more metal layers used to form pads 111A and conductive lines 111B can be formed from Cu, any suitable metal (e.g., a conductive metal, etc.), any suitable metal alloy (e.g., a conductive metal, etc.), and any combination of suitable metals or metal alloys.

With regard now to FIG. 1E, the patterned resist layer 107 may be removed to uncover or reveal one or more portions of the seed layer 105. For one embodiment, no pads 111A and conductive lines 111B are on the uncovered portion(s) of the seed layer 105. This removal operation is performed subsequent to formation of the pads 111A and conductive lines 111B. Unexposed portions of the patterned resist layer 107 may be removed or stripped by conventional techniques, such as by use of one or more resist stripping techniques known in the art, any other suitable technique used for removing resist layers known in the art, and any combination of suitable techniques used for removing resist layers known in the art. As used herein, "an uncovered portion of a layer" and its variations are used to mean that a top surface of the uncovered portion is revealed because no component or layer is on the uncovered portion. As used herein, "a covered portion of a layer" and its variations are used to mean that a top surface of the covered portion is not revealed because one or more components or layers are on the uncovered portion. Side surfaces of a covered portion of a layer may or may not be covered by any component, layer, or material.

With regard now to FIG. 1F, a resist layer 113 can be deposited over surfaces of the unexposed portions of the pads 111A, conductive lines 111B, and the seed layer 105. The resist layer 113 can be similar to or the same as the resist layer 107, which is described above. For one embodiment, the resist layer 113 is patterned using one or more lithography techniques (not shown in FIG. 1F). A lithography technique can include exposing one or more portions of the resist layer 113 to light (e.g., ultra-violet (UV), etc.) via a photomask. The lithography technique may be used to form patterns in the resist layer 113. Any lithography technique known in the art can be used.

Referring now to FIG. 1G, the exposed resist layer 113 described above may be processed using a removal technique can include removing, stripping, or etching away the exposed portions of the resist layer 113 to reveal a pattern comprising openings 115. The pattern can include, but is not limited to, a pattern for one or more pillar structures 117, as described below in connection with FIG. 1H. For one embodiment, the removal technique can be any suitable removal technique known in the art. For example, the removal technique can include chemical etching techniques, etc.

Following removal of exposed portions of the resist layer 113, one or more surfaces of the unexposed portions of the resist layer 113 may or may not be co-planar with one or more surfaces of the unexposed portions of the pads 111A. For a first example, one or more side surfaces of the unexposed portions of the resist layer 113 may or may not be co-planar with one or more side surfaces of the unexposed portions of the pads 111A. For a second example, one or more top surfaces of the unexposed portions of the resist layer 113 may or may not be co-planar with one or more top surfaces of the unexposed portions of the pads 111A.

Referring now to FIG. 1H, pillar structures 117 may be formed in the openings 115 of the patterned resist layer 113 on top surfaces of the pads 111A. In some embodiments, forming the pillar structures 117 may include depositing one or more metal layers in the openings 115 on top surfaces of the pads 111A. For one embodiment, forming the pillar structures 117 comprises performing an electrolytic metal plating operation to plate one or more metal layers (e.g., Cu, etc.) onto the top surfaces of the pads 111A (i.e., the pads 111A, etc.). Top surfaces of the pillar structures 117 may or may not be co-planar with top surfaces of the unexposed portions of the resist layer 107. For one embodiment, the pillar structures 117 have z-heights that are lower than z-heights of the unexposed portions of the resist layer 107. In this way, top surfaces of the pillar structures 117 are not co-planar with top surfaces of the unexposed portions of the resist layer 107. Furthermore, top surfaces of the pillar structures 117 may or may not be co-planar with top surfaces of the unexposed portions of the resist layer 113. For one embodiment, the pillar structures 117 have z-heights that are lower than z-heights of the unexposed portions of the resist layer 113. In this way, top surfaces of the pillar structures 117 are not co-planar with top surfaces of the unexposed portions of the resist layer 107.

For an embodiment, and as shown in FIG. 1H, a pillar structure 117 is fabricated on each pad 111A. For a further embodiment, a pillar structure 117 is fabricated on each pad 111A and not on any of the conductive lines 111B. Each combination of a pillar structure 117 and a pad 111A may be referred to herein as a raised pad structure 119, as shown in FIG. 1H. Consequently, and for one embodiment, each raised pad structure 119 has an increased thickness (e.g., z-height, etc.) that is larger than the thicknesses (e.g., z-heights, etc.) of the other inductor features 111B (e.g., conductive lines 111B, etc.). For one embodiment, each pillar structure 117 is formed on a pad 111A using one or more of the techniques described in one or more of: (i) U.S. Pat. No. 5,888,897 by Chunlin Liang (and/or at least one of its counterpart applications or patents); and (ii) U.S. Pat. No. 9,713,264 by Brandon M. Rawlings et al. (and/or at least one of its counterpart applications or patents). For one embodiment, there is little to no misalignment between a pillar structure 117 and the respective pad 111A on which the pillar structure 117 is fabricated. This misalignment may be measured in terms of dimensions as defined by a coordinate system. For example, misalignment may be measured in terms of dimensions as defined by the x-direction, y-direction, and/or z-direction. For one embodiment, dimensions of the pillar structure 117 and the respective pad 111A are at least approximately similar in all directions other than the direction of the other inductor features 111B (e.g., conductive lines 111B, etc.). Consequently, a raised pad structure 119 is advantageously achieved.

For one embodiment, a size (e.g., width, length, etc.) of the pad 111A is approximately the same as a corresponding size (e.g., width, length, etc.) of the pillar structure 117. In this way, the pad 111A and the pillar structure 117 are aligned or minimally misaligned relative to each other. For this embodiment, one or more surfaces of the pillar structure 117 may be co-planar or substantially co-planar with one or more surfaces of the pad 111A. For example, one or more side surfaces of the pillar structure 117 are co-planar or substantially co-planar with one or more side surfaces of the pad 111A. For a further example, each side surface of the pillar structure 117 is co-planar or substantially co-planar with a corresponding side surface of the pad 111A.

For another embodiment, a size (e.g., width, length, etc.) of the pillar structure 117 is less than or equal to a corresponding size (e.g., width, length, etc.) of pad 111A. In this way, the pad 111A and the pillar structure 117 are aligned or minimally misaligned relative to each other. For this embodiment, one or more surfaces of the pillar structure 117 may be co-planar or substantially co-planar with one or more surfaces of the pad 111A. For example, one or more side surfaces of the pillar structure 117 are co-planar or substantially co-planar with one or more side surfaces of the pad 111A. For a further example, only one side surface of the pillar structure 117 is co-planar or substantially co-planar with a corresponding side surface of the pad 111A.

For yet another embodiment, and as shown in FIG. 1H, a size (e.g., width, length, etc.) of the pillar structure 117 is less than a corresponding size (e.g., width, length, etc.) of pad 111A. In this way, the pillar structure 117 is formed on the pad 111A, even though the pillar structure 117 and the pad 111A are misaligned relative to each other. For this embodiment, one or more surfaces of the pillar structure 117 may not be co-planar or substantially co-planar with one or more surfaces of the pad 111A. For example, one or more side surfaces of the pillar structure 117 are not co-planar or substantially co-planar with one or more side surfaces of the pad 111A. For a further example, each side surface of the pillar structure 117 is not co-planar or substantially co-planar with a corresponding side surface of the pad 111A.

With regard now to FIG. 1I, the patterned resist layer 113 may be removed to uncover or reveal one or more portions of the seed layer 105. For one embodiment, no pads 111A and conductive lines 111B are on the uncovered portion(s) of the seed layer 105. This removal operation is performed subsequent to formation of the pads 111A, conductive lines 111B, and pillar structures 117. Unexposed portions of the patterned resist layer 113 may be removed or stripped by conventional techniques, such as by use of one or more resist stripping techniques known in the art, any other suitable technique used for removing resist layers known in the art, and any combination of suitable techniques used for removing resist layers known in the art.

Referring now to FIG. 1J, the uncovered portion(s) of the seed layer 105 may be removed to uncover or reveal one or more portions of the build-up layer 103. For one embodiment, no portion of the seed layer 105 is on the uncovered portion(s) of the build-up layer 103. This removal operation is performed subsequent to removal of the patterned resist layer 113. The uncovered portion(s) of the seed layer 105 may be removed by conventional techniques, such as by use of one or more etching techniques known in the art, any other suitable technique used for removing seed layers known in the art, and any combination of suitable techniques used for removing seed layers known in the art.

Moving on to FIG. 1K, a magnetic film 121 is used to encapsulate the raised pad structures 119 (i.e., the pads 111A and the corresponding pillar structures 117 on the pads 111A), the other inductor features 111B (e.g., conductive lines 111B, etc.), covered portions of the seed layer 105, and uncovered portions of the build-up layer 103. For one embodiment, the magnetic film 121 is applied using one or more lamination techniques known in the art, one or more printing techniques known in the art, any other suitable technique known in the art for applying or depositing a magnetic film onto a layer of a package substrate, or any combination thereof. Magnetic films are described above.

Referring now to FIG. 1L, one or more planarization techniques may be used to make top surfaces of the raised pad structures 119 and the magnetic film 121 co-planar (or substantially co-planar) with each other. For one embodiment, any known planarization technique may be used. Examples of planarization techniques include, but are not limited to, mechanical planarization techniques (e.g., grinding, polishing, etc.), chemical planarization techniques, and any combination thereof. For an embodiment, one or more mechanical planarization techniques may be used.

With regard now to FIG. 1M, a primer layer 123 may be formed on the co-planar (or substantially co-planar) top surfaces of the raised pad structures 119 and magnetic film 121. The primer layer 123 may be in film form, paste form, or liquid form.

For one embodiment, the primer layer 123 may comprise any suitable material or combination of materials (e.g., ABF, any suitable dielectric material, any combination thereof, etc.). For a specific example, the primer layer 123 comprise any suitable dielectric material known in the art (e.g., a dielectric material suitable for processing by laser drilling and/or ablation techniques, a dielectric material suitable for processing by etching techniques, etc.).

For one embodiment, the primer layer 123 comprises a photoimageable dielectric (PID) layer formed from any suitable PID material known in the art. The PID material may be in film form, paste form, or liquid form. PID materials may comprise positive and/or negative tone PID materials.

For one embodiment, the primer layer 123 may include one or more of the following: (i) a build-up layer (as described above); (ii) a PID layer (as described above); and (iii) a metal mask. For one embodiment, the metal mask is deposited on a build-up layer and/or a PID layer. For this embodiment, the metal mask may be formed from any suitable metal, metal alloy, or any combination of suitable metals and/or metal alloys. For example, the metal mask may be formed from Cu, Ti, and/or Al. For one embodiment, the metal mask is deposited, applied, or formed on the build-up layer and/or the PID layer using any suitable deposition technique. Deposition techniques include, but are not limited to, one or more lamination techniques known in the art, one or more printing techniques known in the art, one or more plating techniques known in the art, one or more sputtering techniques known in the art, any other suitable technique known in the art for depositing, applying, or forming a metal mask onto or on a layer of a package substrate, or any combination thereof. For a first example, when the metal mask is comprises a film (e.g., a Cu film, etc.), the metal mask may be laminated on the build-up layer and/or the PID layer. For a second example, when the metal mask is comprises a foil (e.g., an Al foil), the metal mask may be laminated on the build-up layer and/or the PID layer. For a third example, when the metal mask is comprises a seed layer, the metal mask may be laminated on the build-up layer and/or the PID layer using any suitable technique used for depositing seed layers known in the art. Examples of such techniques are an electroless plating, sputtering, CVD, MOCVD, ALD, any other suitable technique of depositing seed layers, or a combination thereof.

Moving on to FIG. 1N, vias 125 may be formed on the raised pad structures 119 by removing portions of the primer layer 123 above the raised pad structures 119. Removing portions of the primer layer 123 above the raised pad structures 119 can be performed by laser drilling, laser ablation, chemical etching techniques, lithography techniques, any suitable removal technique, and any combination of suitable techniques known in the art of semiconductor fabrication.

For one or more embodiments, a size 127 of a via 125 is less than or equal to a corresponding size 129 of a raised pad structure 119. In this way, the vias 125 are formed exclusively on the top surfaces of the raised pad structures 119 without being formed on the magnetic film 121. For one embodiment, a size 127 (e.g., a width, a length, etc.) of a via 125 is less than or equal to a corresponding size 129 (e.g., a width, a length, etc.) of a top surface of the raised pad structures 119. For one embodiment, a size 127 of a via 125 is approximately equal to a corresponding size 129 of a raised pad structure 119 such that the via 125 and the raised pad structure 119 are aligned or minimally misaligned relative to each other. For one embodiment, a size 127 of a via 125 is less than a corresponding size 129 of a raised pad structure 119 such that the via 125 is formed on the raised pad structure 119 even though the via 125 and the raised pad structured 119 may be misaligned relative to each other.

Vias 125 may be formed using any suitable technique known in the art (e.g., wet or dry etching, lift-off, laser drilling, laser ablation, lithography techniques that are followed by removal techniques, any other suitable technique, any combination of suitable techniques, etc.). Techniques used to form the vias 125 are a design choice that is dependent on the materials that make up the primer layer 123. For one example, where the primer layer 123 includes a build-up layer formed from a dielectric material (e.g., ABF, etc.), laser drilling techniques, laser ablation techniques, desmearing techniques, and/or any other suitable techniques known in the art may be used to remove one or more portions of the build-layer to create cavities in the primer layer 123 above the raised pad structures 119. The cavities in the primer layer 123 reveal top surfaces of the raised pad structures 119. In this way, the vias 125 are formed. For a further version of this example, the vias 125 may be formed after a suitable metal or metal alloy (e.g., Cu, etc.) is deposited using any suitable deposition technique (e.g., plating, sputter seed deposition, etc.) into the cavities. For an even further version of this example, a seed layer may be deposited in the cavities after top surfaces of raised pad structures 119 are revealed and prior to deposition of the metal or metal alloy in the cavities to form the vias 125.

For an example where the primer layer 123 includes a PID layer, vias 125 may be formed by: (i) exposing one or more portions of the PID layer to light (e.g., ultra-violet (UV), etc.) via a photomask, as required by one or more lithography techniques; and (ii) removing any unexposed portion of the PID layer to create cavities in the PID layer by using wet or dry etching, lift-off, stripping (e.g., organic stripping, inorganic stripping, dry stripping, etc.), desmearing techniques, any other suitable technique, or any combination of suitable techniques. Removing the unexposed portions of the PID layer is performed until the cavities reveal top surfaces of the raised pad structures 119. In this way, the vias 125 are formed. For a further version of this example, the vias 125 may be formed after a suitable metal or metal alloy (e.g., Cu, etc.) is deposited using any suitable deposition technique (e.g., plating, sputter seed deposition, etc.) into the cavities. For an even further version of this example, a seed layer may be deposited in the cavities after top surfaces of raised pad structures 119 are revealed and prior to deposition of the metal or metal alloy in the cavities to form the vias 125.

For an example where the primer layer 123 includes a PID layer on a build-up layer formed from a dielectric material, vias 125 may be formed by: (i) exposing one or more portions of the PID layer to light (e.g., ultra-violet (UV), etc.) via a photomask, as required by one or more lithography techniques; (ii) removing any unexposed portion of the PID layer to create cavities in the PID layer by using wet or dry etching, lift-off, doping, stripping (e.g., organic stripping, inorganic stripping, dry stripping, etc.), any other suitable technique, or any combination of suitable techniques; and (iii) further processing the cavities to form the vias 125 by removing portions of the primer layer 123 in the cavities until top surfaces of raised pad structures 119 are revealed. For this example, removing the unexposed portions of the PID layer is performed until the cavities reveal uncovered portions of the build-up layer formed from dielectric materials. Furthermore, laser drilling techniques, laser ablation techniques, desmearing techniques, and/or any other suitable techniques known in the art for removing dielectric materials may be used to remove the uncovered portions of the build-up layer until the cavities reveal top surfaces of the raised pad structures 119. In this way, the vias 125 are formed. For a further version of this example, the vias 125 may be formed after a suitable metal or metal alloy (e.g., Cu, etc.) is deposited using any suitable deposition technique (e.g., plating, sputter seed deposition, etc.) into the cavities. For an even further version of this example, a seed layer may be deposited in the cavities after top surfaces of raised pad structures 119 are revealed and prior to deposition of the metal or metal alloy in the cavities to form the vias 125.

Figure 2A:
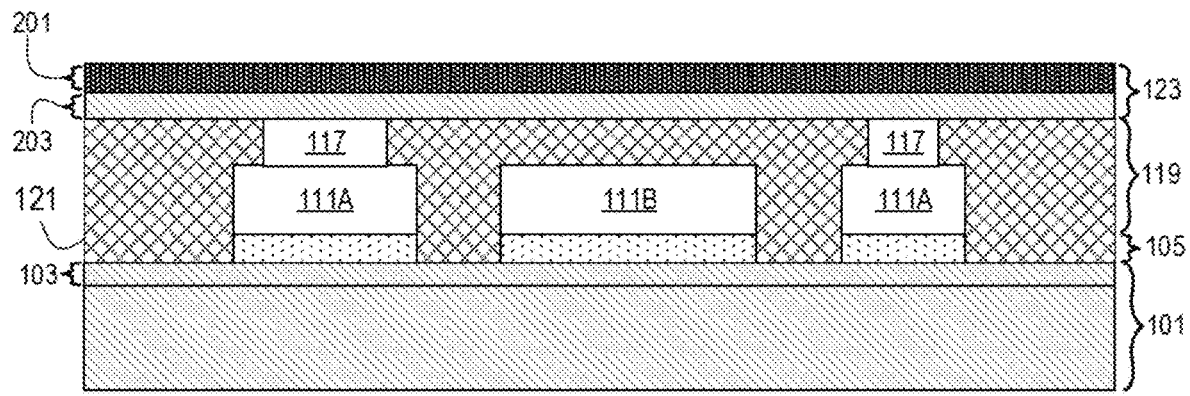
FIGS. 2A-2G are cross-sectional side view illustrations of a method of forming a via in a semiconductor package having one or more magnetic materials embedded therein according to another embodiment. The method shown in FIGS. 2A-2G may be included in the method shown in FIGS. 1A-1S in some embodiments.
Figure 2B:
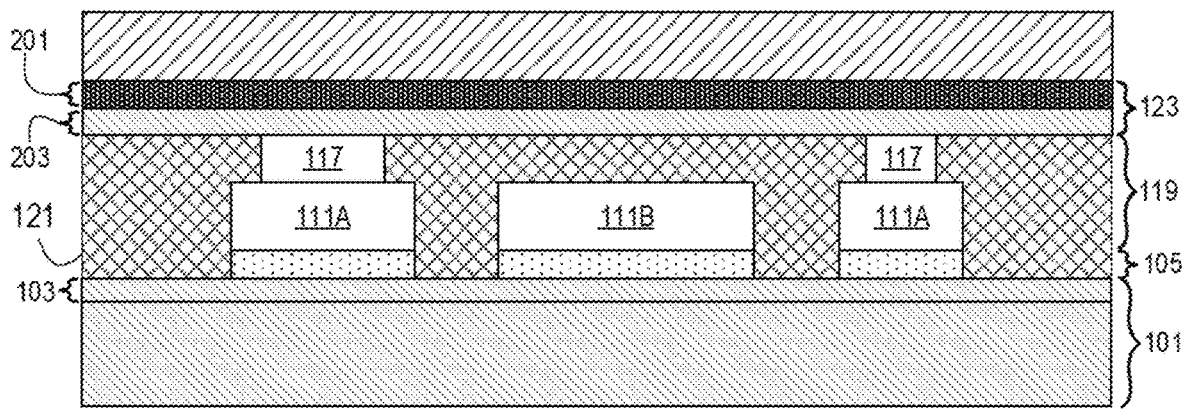
Figure 2C:
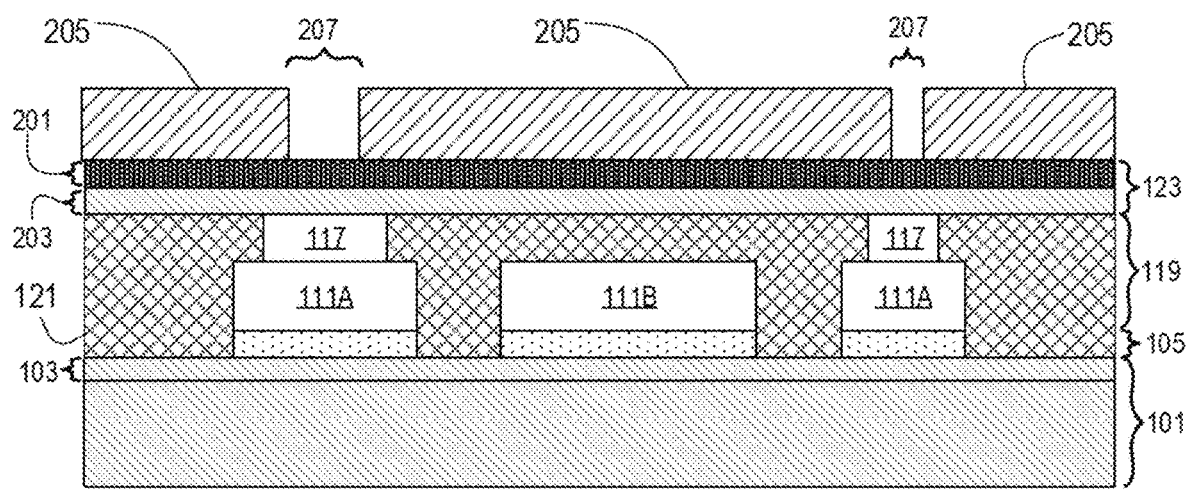
Figure 2D:
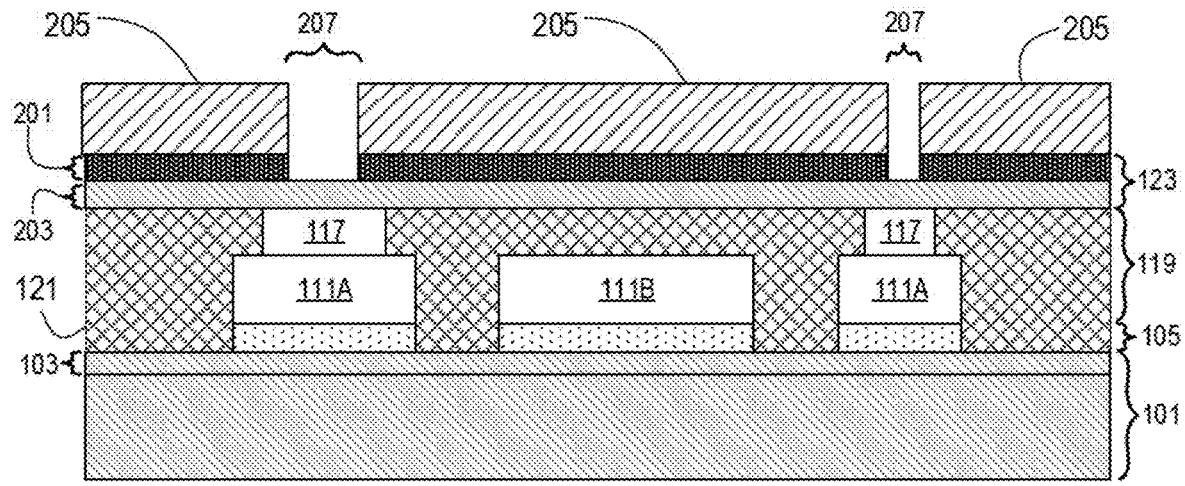
Figure 2E:
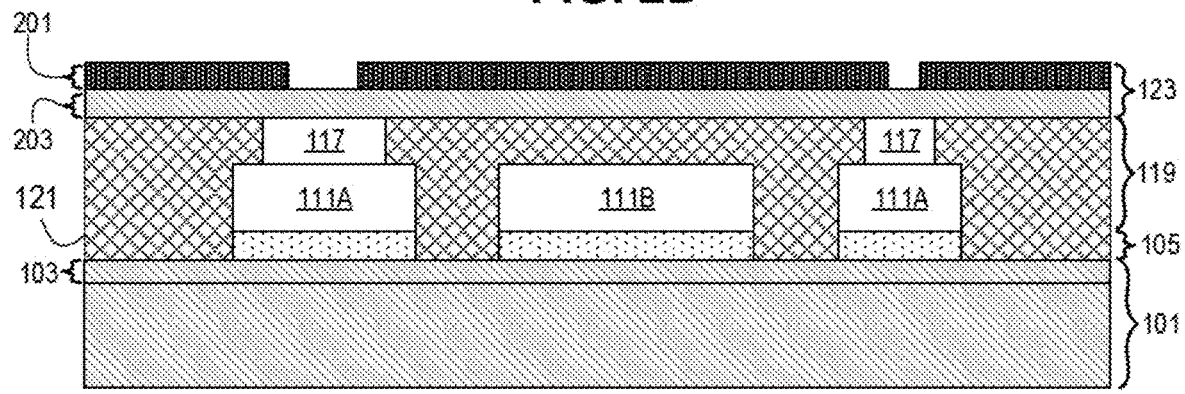
Figure 2F:
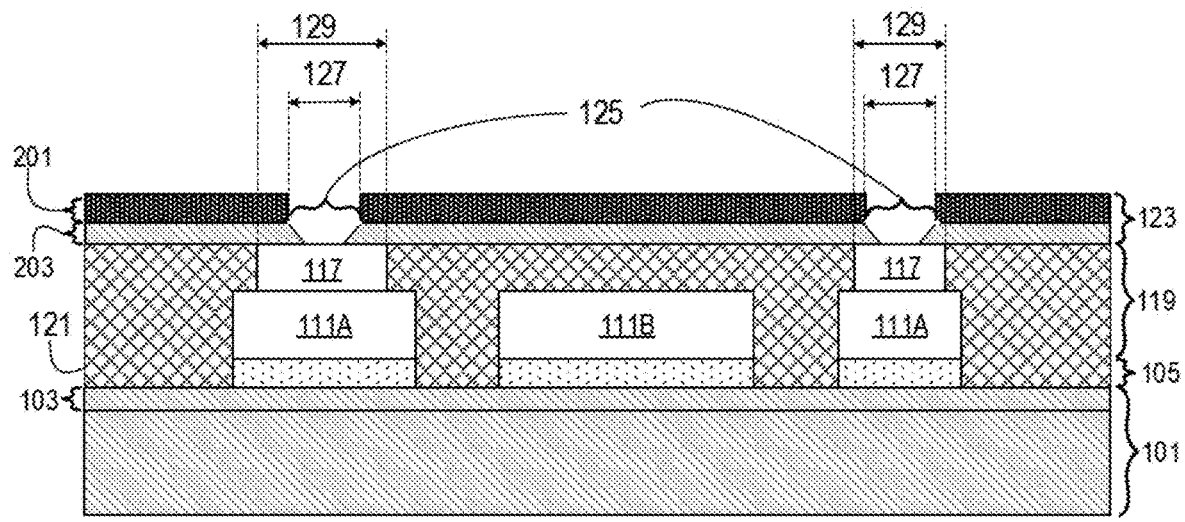
Figure 2G:
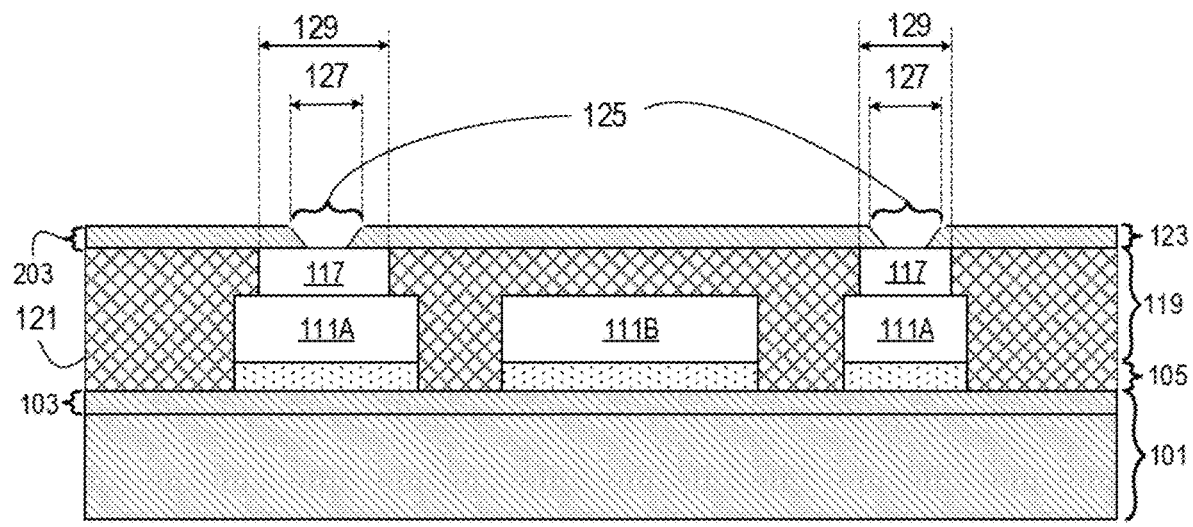

For an example where the primer layer 123 includes a metal mask on a build-up layer formed from a dielectric material (e.g., ABF, etc.), reference is made to FIGS. 2A-2X. With specific regard to FIG. 2A, the primer layer 123 comprises a metal mask 201 on a build-up layer 203. The metal mask 201 can be similar to or the same as the metal mask described above in connection with at least one of FIGS. 1A-1N. The build-up layer 203 can be similar to or the same as any of the build-up layers described above in connection with FIGS. 1A-1N. Next, and as shown in FIG. 2B, a resist layer 205 may be deposited on the metal mask 201. The resist layer 205 can be similar to any of the resist layers described above in connection with FIGS. 1A-1N. Portions of the resist layer 205 above the pillar structures 117 can be exposed via lithography techniques. As shown in FIG. 2C, the exposed portions of the resist layer 205 may be removed via any suitable removal techniques to reveal openings 207. At least one example of a suitable removal technique is described above in connection with FIGS. 1A-1N. Moving on to FIG. 2D, portions of the metal mask 201 in the openings 207 are removed via suitable techniques known in the art (e.g., one or more etching techniques, etc.). With regard now to FIG. 2E, the unexposed portions of the resist layer 205 are removed via suitable techniques (e.g., resist stripping, etc.). Next, and as shown in FIG. 2F, laser drilling techniques, laser ablation techniques, etching techniques, desmearing techniques, and/or any other suitable techniques known in the art may be used to remove one or more portions of the build-layer to create cavities in the primer layer 123 above the raised pad structures 119. For one embodiment, the cavities are formed using a plasma etching technique (e.g., a fluorine-based plasma etching technique, etc.). In this way, the vias 125 are formed. The cavities in the primer layer 123 reveal top surfaces of the raised pad structures 119. In this way, the vias 125 are formed. With specific regard now to FIG. 2G, any remaining portions of the metal mask 201 may be removed after vias 125 are formed. For one embodiment, removal of the metal mask 201 includes etching (e.g., flash etching, etc.) the remaining portions of the metal mask 201 to reveal uncovered top surfaces of the build-up layer 203. For a further embodiment, the vias 125 may be processed using a desmearing technique to clean any residue in the vias 125 after the remaining portions of the metal mask 201 are removed.

Two or more of the immediately preceding examples may be combined. For example, the primer layer 123 can comprise a metal mask on one or more of: (i) a PID layer; and (ii) a build-up layer. As shown by the immediately preceding examples, vias 125 may be formed using one or more suitable techniques. At least one of the vias 125 shown in FIG. 1N has a tapered shape; however, at least one of the vias 125 may have another shape (e.g., a non-tapered shape, etc.).

Moving back to FIG. 1O, one or more layer(s) 131 may be formed after vias 125 are formed. The layer(s) 131 may include any suitable layers (e.g., seed layer, resist layer, passivation layer, etc.). As shown in FIG. 1O, conductive structures 133 are formed over the vias 125 for coupling the raised pad structures 119 to the layer(s) 131. The conductive structures 133 may be formed using any suitable technique (s). For one example, formation of conductive structures 133 may include one or more of the following operations: (i) depositing a seed layer on top surfaces of the primer layer 123 and the raised pad structures 119; (i) depositing a resist layer on the seed layer; (ii) patterning the resist layer by exposing one or more portions of the resist layer using one or more lithography techniques; (iii) removing any unexposed portion(s) of the resist layer to create openings above the vias 125 in the remaining portion(s) of the resist layer; and (iv) plating one or more conductive materials (e.g., metal, metal alloy, etc.) into the openings above the vias 125. For an alternate example, the seed layer is deposited in the openings above the vias 125 prior to plating one or more metal layers into the openings above the vias 125. In the illustrated embodiment shown in FIG. 1O the conductive structures 133 are shown as pillars. Other embodiments, however, are not so limited. The structures 133 may have any shape and/or size (e.g., z-height, etc.). For one example, the structures 133 may be pads.

After the operations shown in FIG. 1O are performed, a semiconductor package portion 100 comprising pads 111A, conductive lines 111B, and a magnetic film 121 is formed. The semiconductor package portion 100 may be subjected additional operations/processes (not shown in FIGS. 1A-1O) in order to fabricate a complete semiconductor package. These additional operations/processes include one or more current semiconductor fabrication processes that comply with current industry standards. Examples include, but are not limited to, desmearing processes, electroless plating processes, seed etching processes, and processes involving roughening baths. For one embodiment, a complete semiconductor package may comprise one or more portions 100.

For one embodiment, the semiconductor package portion 100 is not affected (or not as affected) by one or more of the drawbacks associated with some proposed ACIs having magnetic films. For a first example, any additional operation (s) in compliance with current industry standards may be performed on the semiconductor package portion 100 without requiring costly tailoring of the magnetic film 121. This is at least because the primer layer 123, the vias 125, and the raised pad structures 119 isolate the pads 111A, conductive lines 111B and the magnetic filler 121 from interacting with bath chemistries, materials, and/or tools used in the additional operation(s). For a second example, there is a minimized risk of contaminating bath chemistries, materials, and/or tools used in the additional operation(s) performed on the semiconductor package portion 100. This is also at least because the primer layer 123, the vias 125, and the raised pad structures 119 isolate the pads 111A, conductive lines 111B, and the magnetic 121 from interacting with bath chemistries, materials, and/or tools used in the additional operation(s). For a third example, there is a minimized risk of having dirty vias in the semiconductor package portion 100. This is because the vias 125 are fabricated through the primer layer 123 directly above the raised pad structures 119 (and not through the primer layer 123 directly above the magnetic film 121, the pads 111A, and/or the conductive lines 111B). That is, any techniques used for forming the vias 125 (e.g., laser drilling, laser ablation, any other suitable technique known in the art, any combination thereof, etc.) is not applied to or used to contaminate the magnetic film 121, the pads 111A, and/or the conductive lines 111B.

Referring now to FIGS. 1P-1S, which illustrate one or more exemplary additional operations/processes that may be performed after the semiconductor portion 100 is formed. With specific regard to FIG. 1P, formation of the layer(s) 131 includes forming the conductive structures 133 and conductive lines 135. The conductive lines 135 may be formed using any suitable technique. For example, the technique used to form the conductive structures 133, as described above in connection with FIG. 1N, may be used to form the conductive lines 135. For one or more embodiments, thicknesses of the conductive lines 135 (e.g., z-heights, etc.) may or may not be equal to thicknesses of the conductive structures 133 (e.g., z-heights, etc.). For one embodiment, thicknesses of the conductive lines 135 (e.g., z-heights, etc.) are equal or substantially equal to thicknesses of the conductive structures 133 (e.g., z-heights, etc.).

With regard now to FIG. 1Q, formation of the layer(s) 131 may include encapsulating the conductive structures 133, the conductive lines 135, and the uncovered top surfaces of the primer layer 123 in a solder resist composition 137. For one embodiment, encapsulation of the conductive structures 133, the conductive lines 135, and the uncovered top surfaces of the primer layer 123 is performed by lamination of the solder resist composition 137.

Moving on to FIG. 1R, the solder resist composition 137 may be opened using one or more suitable techniques that create vias 139 and opening 141. For one embodiment, the vias 139 are designed such that top surfaces of the conductive structures 133 are partially or completely uncovered. For one embodiment, the opening 141 is designed such that: (i) one or more portions of the solder resist composition 137 encapsulating the conductive lines 135 are removed; and (ii) one or more portions of the solder resist composition 137 encapsulating one or more portions of the top surface of the primer layer 123 are removed. For a further embodiment, the exposed or uncovered portion(s) of the top surface of the primer layer 123 are adjacent to the exposed or uncovered conductive lines 135. Techniques used to create vias 139 and the opening 141 include laser drilling, laser ablation, etching, chemical stripping, lithography, any other suitable technique, and any combination of suitable techniques known in the art.

Referring now to FIG. 1S, a magnetic paste 143 may be deposited into the opening 141 and used to encapsulate the conductive lines 135. The magnetic paste 143, according to various embodiments can be a non-conductive epoxy or a polymer filled with magnetic fillers. The magnetic paste 143 may, in one or more embodiments, be formed from any suitable magnetic paste powders known in the art (e.g., manganese zinc ferrite, any other suitable magnetic paste, any combination of suitable magnetic pastes, etc.). Magnetic pastes are described above. Furthermore, any suitable technique for depositing a magnetic paste known in the art may be used to deposit the magnetic paste 143 into the opening 141.

After the operations described in connection with FIG. 1S are performed, a semiconductor package portion 190 comprising a set of raised pads 119, a first set of conductive lines 111B, a magnetic film 121, a set of conductive structures 133, a second set of conductive lines 135, and a magnetic paste 143 is formed. The semiconductor package portion 190 may be subjected additional operations/processes (not shown in FIGS. 1A-1S) in order to fabricate a complete semiconductor package. One or more of these additional operations/processes are described above in connection with at least FIG. 1N. For one embodiment, a complete semiconductor package may comprise one or more portions 190. Furthermore, the semiconductor package portion 190 has similar or the same advantages as the advantages described above in connection with the semiconductor package portion 100.

Various operations are described in connection with FIGS. 1A-1S (and with the figure(s) described below) as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired.

Figure 3:
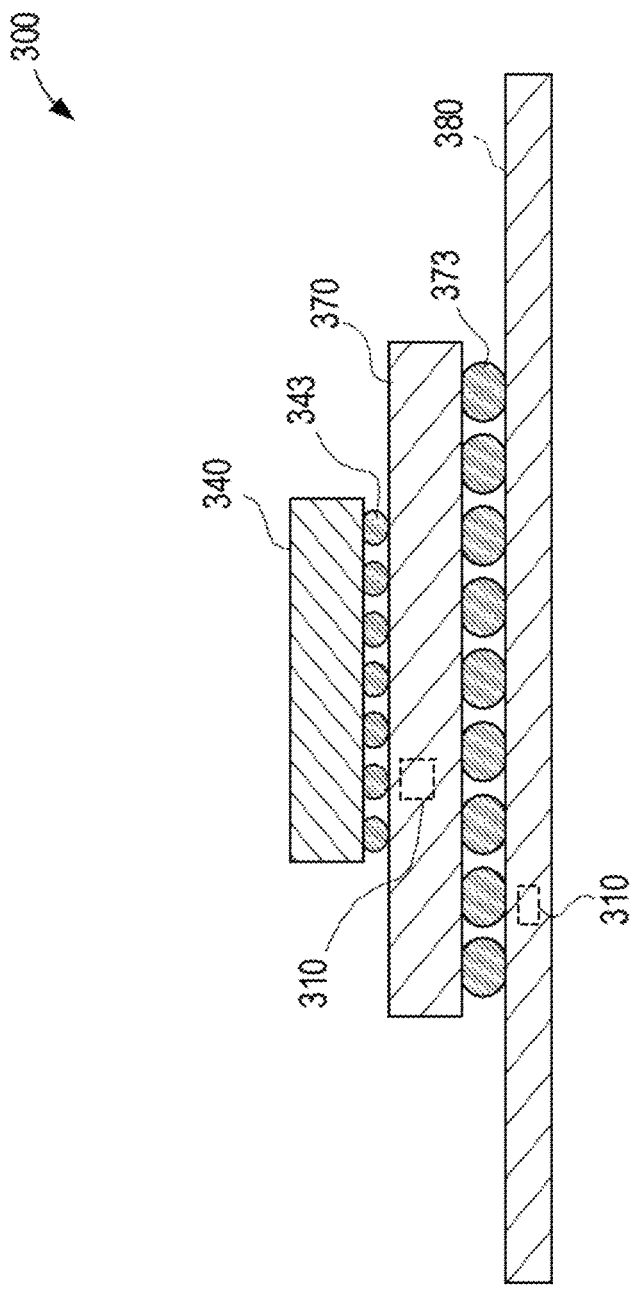
FIG. 3 illustrates a cross-sectional illustration of a packaged system, according to an embodiment.

Referring now to FIG. 3, a cross-sectional illustration of a packaged system 300 is shown, in accordance with an embodiment. For an embodiment, the packaged system 300 may include a semiconductor die 340 electrically coupled to a package substrate 370 with solder bumps 343. For additional embodiments, the semiconductor die 340 may be electrically coupled to the package substrate 370 with any suitable interconnect architecture, such as wire bonding or the like. The package substrate 370 may be electrically coupled to a board, such as a printed circuit board (PCB) 380, with solder bumps 373. For additional embodiments, the package substrate 370 may be electrically coupled to a board, such as the PCB 380, with any suitable interconnect architecture, such as wire bonding or the like.

For an embodiment, an electronic component 310 (e.g., an inductor, any other electronic component that includes magnetic materials, etc.) formed based on one or more of the embodiments described above may be integrated into: (i) the package substrate 370; (ii) the board 380; or (iii) the package substrate 370 and the board 380. Embodiments include any number of electronic components 310 formed into the package substrate 370 and/or the board 380. For example, a plurality of inductors 310 may be integrated—for power management, filtering, or any other desired use—into: (i) the package substrate 370; (ii) the board 380; or (iii) the package substrate 370 and the board 380.

Figure 4:
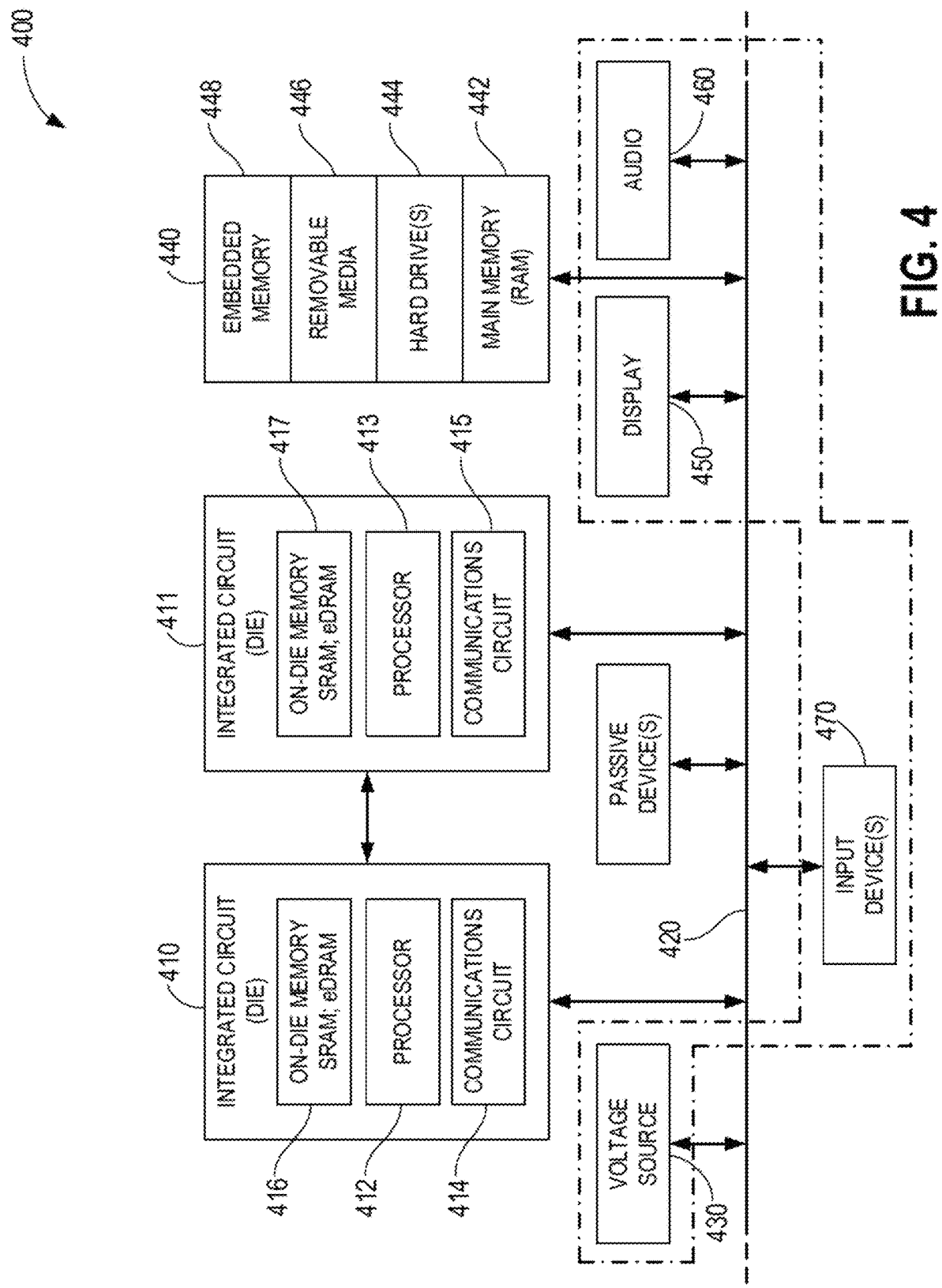
FIG. 4 is an illustration of a schematic block diagram of a computer system that utilizes a semiconductor package, according to an embodiment.

FIG. 4 illustrates a schematic of computer system 400 according to an embodiment. The computer system 400 (also referred to as an electronic system 400) can include a semiconductor package having one or more magnetic materials embedded therein in accord with any of the embodiments and their equivalents as set forth in this disclosure. The computer system 400 may be a mobile device, a netbook computer, a wireless smart phone, a desktop computer, a hand-held reader, a server system, a supercomputer, or a high-performance computing system.

The system 400 can be a computer system that includes a system bus 420 to electrically couple the various components of the electronic system 400. The system bus 420 is a single bus or any combination of busses according to various embodiments. The electronic system 400 includes a voltage source 430 that provides power to the integrated circuit 410. For one embodiment, the voltage source 430 supplies current to the integrated circuit 410 through the system bus 420.

The integrated circuit 410 is electrically coupled to the system bus 420 and includes any circuit, or combination of circuits according to an embodiment. For an embodiment, the integrated circuit 410 includes a processor 412. As used herein, the processor 412 may mean any type of circuit such as, but not limited to, a microprocessor, a microcontroller, a graphics processor, a digital signal processor, or another processor. For an embodiment, the processor 412 includes, or is coupled with, a semiconductor package having one or more magnetic materials embedded therein in accord with any of the embodiments and their equivalents, as described in the foregoing specification. For an embodiment, SRAM embodiments are found in memory caches of the processor. Other types of circuits that can be included in the integrated circuit 410 are a custom circuit or an application-specific integrated circuit (ASIC), such as a communications circuit 414 for use in wireless devices such as cellular telephones, smart phones, pagers, portable computers, two-way radios, and similar electronic systems, or a communications circuit for servers. For an embodiment, the integrated circuit 410 includes on-die memory 416 such as static random-access memory (SRAM). For an embodiment, the integrated circuit 410 includes embedded on-die memory 416 such as embedded dynamic random-access memory (eDRAM). For one embodiment, the on-die memory 416 may be packaged with a process in accord with any of the embodiments and their equivalents, as described in the foregoing specification.

For an embodiment, the integrated circuit 410 is complemented with a subsequent integrated circuit 411. Useful embodiments include a dual processor 413 and a dual communications circuit 415 and dual on-die memory 417 such as SRAM. For an embodiment, the dual integrated circuit 410 includes embedded on-die memory 417 such as eDRAM.

For an embodiment, the electronic system 400 also includes an external memory 440 that in turn may include one or more memory elements suitable to the particular application, such as a main memory 442 in the form of RAM, one or more hard drives 444, and/or one or more drives that handle removable media 446, such as diskettes, compact disks (CDs), digital variable disks (DVDs), flash memory drives, and other removable media known in the art. The external memory 440 may also be embedded memory 448 such as the first die in a die stack, according to an embodiment.

For an embodiment, the electronic system 400 also includes a display device 450 and an audio output 460. For an embodiment, the electronic system 400 includes an input device such as a controller 470 that may be a keyboard, mouse, trackball, game controller, microphone, voice recognition device, or any other input device that inputs information into the electronic system 400. For an embodiment, an input device 470 is a camera. For an embodiment, an input device 470 is a digital sound recorder. For an embodiment, an input device 470 is a camera and a digital sound recorder.

At least one of the integrated circuits 410 or 411 can be implemented in a number of different embodiments, including a semiconductor package having one or more magnetic materials embedded therein as described herein, an electronic system, a computer system, one or more methods of fabricating an integrated circuit, and one or more methods of fabricating an electronic assembly that includes a semiconductor package having one or more magnetic materials embedded therein, according to any disclosed embodiments set forth herein and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the semiconductor package having one or more magnetic materials embedded therein in accordance with any of the disclosed embodiments as set forth herein and their art-recognized equivalents. A foundation substrate may be included, as represented by the dashed line of FIG. 4. Passive devices may also be included, as is also depicted in FIG. 4.

Reference throughout this specification to "one embodiment," "an embodiment," "another embodiment" and their variations means that a particular feature, structure, configuration, or characteristic described in connection with the embodiment is included in at least one embodiment. Thus, the appearances of the phrase "for one embodiment," "for an embodiment," "for another embodiment," "in one embodiment," "in an embodiment," "in another embodiment," or their variations in various places throughout this specification are not necessarily referring to the same embodiment. Furthermore, the particular features, structures, configurations, or characteristics may be combined in any suitable manner in one or more embodiments.

The terms "over," "to," "between," "onto," and "on" as used in the foregoing specification refer to a relative position of one layer with respect to other layers. One layer "over" or "on" another layer or bonded "to" or in "contact" with another layer may be directly in contact with the other layer or may have one or more intervening layers. One layer "between" layers may be directly in contact with the layers or may have one or more intervening layers.

The description provided above in connection with one or more embodiments as described herein that is included as part of a process of forming semiconductor packages may also be used for other types of IC packages and mixed logic-memory package stacks. In addition, the processing sequences may be compatible with both wafer level packages (WLP), and integration with surface mount substrates such as LGA, QFN, and ceramic substrates.

In the foregoing specification, abstract, and/or figures, numerous specific details are set forth, such as specific materials and processing operations, in order to provide a thorough understanding of embodiments described herein. It will, however, be evident that any of the embodiments described herein may be practiced without these specific details. In other instances, well-known features, such as the integrated circuitry of semi conductive dies, are not described in detail in order to not unnecessarily obscure embodiments described herein. Furthermore, it is to be understood that the various embodiments shown in the Figures and described in connection with the Figures are illustrative representations and are not necessarily drawn to scale. Thus, various modifications and/or changes may be made without departing form the broader spirit and scope of the embodiments described in connection with the foregoing specification, abstract, and/or Figures.

Embodiments described herein include a method of forming a cored or coreless semiconductor package, comprising: forming a pad and a conductive line on a build-up layer; forming a raised pad structure on the build-up layer, wherein forming the raised pad structured comprises fabricating a pillar structure on the pad; encapsulating the conductive line and the raised pad structure in a magnetic film, the magnetic film comprising one or more magnetic fillers; planarizing a top surface of the magnetic film until top surfaces of the raised pad structure and the magnetic film are co-planar; depositing a primer layer on the top surfaces of the raised pad structure and the magnetic film; removing one or more portions of the primer layer above the raised pad structure to create an opening; and forming a via in the opening, the via being on the raised pad structure.

Additional embodiments include a method according to one or more embodiments described herein, wherein forming the pad and the conductive line comprises: lithographically exposing portions of a first resist layer on the build-up layer; removing the exposed portions of the first resist layer to create a first set of openings; depositing metallic materials in the first set of openings; and removing any lithographically unexposed portion of the first resist layer.

Additional embodiments include a method according to one or more embodiments described herein, wherein forming the pillar structure comprises: lithographically exposing a portion of a second resist layer on uncovered surfaces of the pad, the conductive line, and the build-up layer; removing the exposed portion of the second resist layer to create a second opening on the pad; depositing metallic materials in the second opening; and removing any lithographically unexposed portion of the second resist layer.

Additional embodiments include a method according to one or more embodiments described herein, wherein the raised pad structure has a z height that is larger than a z height of the conductive line.

Additional embodiments include a method according to one or more embodiments described herein, wherein planarizing a top surface of the magnetic film comprises using a mechanical planarization technique to planarize the top surface of the magnetic film until top surfaces of the raised pad structure and the magnetic film are co-planar.

Additional embodiments include a method according to one or more embodiments described herein, wherein a size of the via is less than or equal to a corresponding size of the raised pad structure.

Additional embodiments include a method according to one or more embodiments described herein, further comprising forming a conductive structure over the via.

Additional embodiments include a method according to one or more embodiments described herein, further comprising forming a second pad and a second conductive line on the primer layer.

Additional embodiments include a method according to one or more embodiments described herein, further comprising encapsulating the second conductive line in a magnetic paste.

Additional embodiments include a method according to one or more embodiments described herein, wherein the primer layer comprises one or more of: (i) a second build-up layer; and (ii) a photoimageable dielectric (PID) layer.

Additional embodiments include a method according to one or more embodiments described herein, wherein the primer layer further comprises a metal mask on one or more of: (i) the second build-up layer; and (ii) the PID layer.

Additional embodiments include a method according to one or more embodiments described herein, wherein, when the primer layer comprises a metal mask on the second build-up layer, forming the via in the opening comprises: depositing a resist layer on the metal mask; lithographically exposing a portion of the resist layer on the metal mask that is above the pillar structure; removing the lithographically exposed portion of the resist layer to create the opening; removing a portion of the metal mask in the opening; removing any lithographically unexposed portion of the resist layer; removing a portion of the second build-up layer that is above the pillar structure to enlarge the opening; forming the via in the opening; and removing any remaining portion of the metal mask on the second build-up layer.

Additional embodiments include a method according to one or more embodiments described herein, wherein removing the portion of the second build-up layer that is above the pillar structure to enlarge the opening comprises plasma etching the second build-up layer that is above the pillar structure.

Additional embodiments include a method according to one or more embodiments described herein, further comprising desmearing the via to remove any residue in the via.

Additional embodiments include a method according to one or more embodiments described herein, wherein an inductor in the cored or coreless semiconductor package comprises one or more of: the pad; the conductive line; the raised pad structure; the magnetic film; the primer layer; the via; the conductive structure; the second pad; the second conductive line; and the magnetic paste.

Additional embodiments include a method according to one or more embodiments described herein, wherein the magnetic film comprises: (i) one or more of an epoxy resin, a polyimide, and a glass-reinforced epoxy laminate material (e.g., FR4, G10, G11, FR4, FR5, FR6, etc.); and (ii) the one or more magnetic fillers.

Additional embodiments include a method according to one or more embodiments described herein, wherein the magnetic film comprises an organic dielectric epoxy laminate film having the one or more magnetic fillers therein.

Additional embodiments include a method according to one or more embodiments described herein, wherein at least one of the one or more magnetic fillers is formed from one or more of: (i) a ferromagnetic material; and (ii) a ferrimagnetic material.

Additional embodiments include a method according to one or more embodiments described herein, wherein at least one of the one or more magnetic fillers is formed from one or more of: iron (Fe), cobalt (Co), nickel (Ni), any ferrite that includes Fe and oxygen (O), ferrous oxide (FeO), a metal alloy comprising one or more of Fe, Co, and Ni (e.g., CoFe, NiFe, etc.), any ferromagnetic material, and any ferrimagnetic material.

Embodiments described herein include a cored or coreless semiconductor package formed in accordance with a method according to one or more embodiments described herein.

In the description, drawings, and claims provided herein, the use of "at least one of A, B, and C", "at least one of A, B, or C", "one or more of A, B, or C", or "one or more of A, B, and C" is intended encompass: (i) A alone; (ii) B alone; (iii) C alone; (iv) A and B together; (v) A and C together; (vi) B and C together; or (vii) A, B, and C together. Furthermore, the use of "A, B, and/or C" is intended encompass: (i) A alone; (ii) B alone; (iii) C alone; (iv) A and B together; (v) A and C together; (vi) B and C together; or (vii) A, B, and C together. It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrases "A or B", "A and B", and "A and/or B" will be understood to include the possibilities of "A alone" or "B alone" or "A and B."

The term "via" and its variations refer to a vertical interconnect access as is known in the art. The terms used in the following claims should not be construed to limit any embodiments described in connection with the foregoing specification, abstract, and/or Figures to the specific embodiments set forth in the foregoing specification, abstract, Figures, and/or claims. Rather, the scope of the claims are to be construed in accordance with established doctrines of claim interpretation.

What is claimed is:

1. A semiconductor package, comprising:
   a pad and a conductive line on a build-up layer, wherein the conductive lines has an uppermost surface;
   a raised pad structure on the build-up layer, wherein the raised pad structured comprises a pillar structure on the pad;
   a magnetic film encapsulating the conductive line and the raised pad structure, the magnetic film comprising one or more magnetic fillers, wherein top surfaces of the raised pad structure and the magnetic film are co-planar, and wherein the magnetic film is on an entirety of the uppermost surface of the conductive line;
   a primer layer on the top surfaces of the raised pad structure and the magnetic film, wherein the primer layer comprises a second build-up layer; and
   a via on the raised pad structure.

2. The semiconductor package of claim 1, wherein the raised pad structure has a z-height that is larger than a z-height of the conductive line.

3. The semiconductor package of claim 1, wherein a size of the via is less than or equal to a corresponding size of the raised pad structure.

4. The semiconductor package of claim 1, further comprising a conductive structure over the via.

5. The semiconductor package of claim 4, further comprising a second pad and a second conductive line on the primer layer.

6. The semiconductor package of claim 4, further comprising a magnetic paste encapsulating the second conductive line.

7. The semiconductor package of claim 1, wherein the primer layer further comprises a metal mask on the second build-up layer.

8. The semiconductor package of claim 1, wherein the magnetic film comprises: (i) one or more of an epoxy resin, a polyimide, and an epoxy laminate material; and (ii) one or more magnetic fillers, and wherein the one or more magnetic fillers comprise one or more of a ferromagnetic material and a ferrimagnetic material.

9. A method of forming a cored or coreless semiconductor package, comprising:
   forming a pad and a conductive line on a build-up layer;

forming a raised pad structure on the build-up layer, wherein forming the raised pad structured comprises fabricating a pillar structure on the pad;

encapsulating the conductive line and the raised pad structure in a magnetic film, the magnetic film comprising one or more magnetic fillers;

planarizing a top surface of the magnetic film until top surfaces of the raised pad structure and the magnetic film are co-planar;

depositing a primer layer on the top surfaces of the raised pad structure and the magnetic film;

removing one or more portions of the primer layer above the raised pad structure to create an opening; and forming a via in the opening, the via being on the raised pad structure.

10. The method of claim 9, wherein forming the pad and the conductive line comprises:

lithographically exposing portions of a first resist layer on the build-up layer;

removing the exposed portions of the first resist layer to create a first set of openings;

depositing metallic materials in the first set of openings; and removing any lithographically unexposed portion of the first resist layer.

11. The method of claim 10, wherein forming the pillar structure comprises:

lithographically exposing a portion of a second resist layer on uncovered surfaces of the pad, the conductive line, and the build-up layer;

removing the exposed portion of the second resist layer to create a second opening on the pad;

depositing metallic materials in the second opening; and removing any lithographically unexposed portion of the second resist layer.

12. The method of claim 9, wherein the raised pad structure has a z-height that is larger than a z-height of the conductive line.

13. The method of claim 9, wherein planarizing a top surface of the magnetic film comprises using a mechanical planarization technique to planarize the top surface of the magnetic film until top surfaces of the raised pad structure and the magnetic film are co-planar.

14. The method of claim 9, wherein a size of the via is less than or equal to a corresponding size of the raised pad structure.

15. The method of claim 9, further comprising forming a conductive structure over the via.

16. The method of claim 15, further comprising forming a second pad and a second conductive line on the primer layer.

17. The method of claim 16, further comprising encapsulating the second conductive line in a magnetic paste.

18. The method of claim 9, wherein the primer layer comprises one or more of: (i) a second build-up layer; and (ii) a photoimageable dielectric (PID) layer.

19. The method of claim 18, wherein the primer layer further comprises a metal mask on one or more of: (i) the second build-up layer; and (ii) the PID layer.

20. The method of claim 19, wherein, when the primer layer comprises a metal mask on the second build-up layer, forming the via in the opening comprises:

depositing a resist layer on the metal mask;

lithographically exposing a portion of the resist layer on the metal mask that is above the pillar structure;

removing the lithographically exposed portion of the resist layer to create the opening;

removing a portion of the metal mask in the opening;

removing any lithographically unexposed portion of the resist layer;

removing a portion of the second build-up layer that is above the pillar structure to enlarge the opening;

forming the via in the opening; and removing any remaining portion of the metal mask on the second build-up layer.

21. The method of claim 19, wherein removing the portion of the second build-up layer that is above the pillar structure to enlarge the opening comprises plasma etching the second build-up layer that is above the pillar structure.

22. The method of claim 19, further comprising desmearing the via to remove any residue in the via.

23. A semiconductor package, comprising:

a pad and a conductive line on a build-up layer, wherein the conductive lines has an uppermost surface;

a raised pad structure on the build-up layer, wherein the raised pad structured comprises a pillar structure on the pad;

a magnetic film encapsulating the conductive line and the raised pad structure, the magnetic film comprising one or more magnetic fillers, wherein top surfaces of the raised pad structure and the magnetic film are co-planar, and wherein the magnetic film is on an entirety of the uppermost surface of the conductive line;

a primer layer on the top surfaces of the raised pad structure and the magnetic film, wherein the primer layer comprises a photoimageable dielectric (PID) layer; and a via on the raised pad structure.

24. The semiconductor package of claim 23, wherein the primer layer further comprises a metal mask on the PID layer.

25. The semiconductor package of claim 24, further comprising:

a second pad and a second conductive line on the primer layer; and a magnetic paste encapsulating the second conductive line.

* * * * *